United States Patent [19]
Sano et al.

[11] Patent Number: 5,175,780
[45] Date of Patent: Dec. 29, 1992

[54] OPTICAL FIBER SWITCH

[75] Inventors: Yasukazu Sano; Hideyuki Tanaka; Keijirou Nakamura; Hideo Kume; Kiyoshi Tanigawa, all of Kawasaki, Japan

[73] Assignee: Fuji Electric Co., Ltd., Kawasaki, Japan

[21] Appl. No.: 698,380

[22] Filed: May 9, 1991

Related U.S. Application Data

[63] Continuation of Ser. No. 456,853, Dec. 26, 1989, abandoned.

[30] Foreign Application Priority Data

Dec. 29, 1988 [JP] Japan .................. 63-332811
Jun. 13, 1989 [JP] Japan .................. 1-149806
Sep. 1, 1989 [JP] Japan .................. 1-226818
Sep. 26, 1989 [JP] Japan .................. 1-250304
Dec. 4, 1989 [JP] Japan .................. 1-314654

[51] Int. Cl.⁵ .......................... G02B 6/26; H01J 5/16
[52] U.S. Cl. ........................... 385/47; 385/18; 385/19; 385/33; 385/37; 385/55; 385/77; 250/227.22
[58] Field of Search .............. 350/96.15, 96.16, 96.18, 350/96.19, 96.20, 96.21, 96.22; 250/227.22, 227.11; 385/33, 35, 36, 37, 47, 55, 62, 81, 77, 79

[56] References Cited

U.S. PATENT DOCUMENTS

| | | | |
|---|---|---|---|
| 4,013,342 | 3/1977 | Narodny | 250/227.22 X |
| 4,057,719 | 11/1977 | Lewis | 250/227.22 X |
| 4,170,731 | 10/1979 | Howell et al. | 385/19 X |
| 4,315,147 | 2/1982 | Harmer | 250/227.22 X |
| 4,422,714 | 12/1983 | Benoit et al. | 385/39 |
| 4,437,728 | 3/1984 | Ohashi | 385/18 |
| 4,607,160 | 8/1986 | Sakakino | 250/227.11 |
| 4,674,831 | 6/1987 | Bagby | 385/19 |
| 4,705,348 | 11/1987 | Matsunaga et al. | 385/18 |
| 4,789,228 | 12/1988 | Le Pesant et al. | 359/320 |
| 4,836,636 | 6/1989 | Obara et al. | 385/19 |
| 5,028,104 | 7/1991 | Kokoshvili | 385/18 |
| 5,048,912 | 9/1991 | Kunikane et al. | 385/35 |

FOREIGN PATENT DOCUMENTS

| | | | |
|---|---|---|---|
| 0012274 | 6/1980 | European Pat. Off. | 385/18 X |
| 58-89727 | 5/1983 | Japan | 385/18 X |
| 60-12217 | 1/1985 | Japan | 385/16 X |
| 60-42222 | 3/1985 | Japan | 385/16 X |
| 61-721 | 1/1986 | Japan | 385/16 X |
| 62-35237 | 9/1987 | Japan | 385/18 X |
| 63-29722 | 2/1988 | Japan | 385/19 X |
| 63-123012 | 5/1988 | Japan | 385/19 X |
| 63-193122 | 8/1988 | Japan | 385/19 X |

Primary Examiner—Brian Healy
Attorney, Agent, or Firm—Spencer, Frank & Schneider

[57] ABSTRACT

An optical switch having two spherical or elliptical corner-reflecting surfaces provided in a light-conducting member, a shutter to open and close a light path between the corner-reflecting surfaces, and focusing lenses to focus the incident beam from an emitting optical fiber and to focus the emitting beam from the light-conducting member to a primary receiving optical fiber. Because almost all the beam transmitted through the light-conducting member is focused at one point in an air gap in which the shutter moves, the optical switch can transmit the beam with high efficiency without leakage to the outside, and a small stroke of the shutter is sufficient to completely transmit or stop the beam. In another similar optical switch having a reflecting surface at the tip of the shutter for inclining the beam, as well as having a secondary receiving optical fiber aligned with the path of the inclined beam, the beam is switched to be transmitted to the primary receiving optical fiber or to the secondary receiving optical fiber according to the position of the shutter. Thus, the ON/OFF state of the optical switch can be indicated, or a transfer-type optical switch can be obtained by using the secondary receiving optical fiber as well as the primary receiving optical fiber as switching circuits.

25 Claims, 16 Drawing Sheets

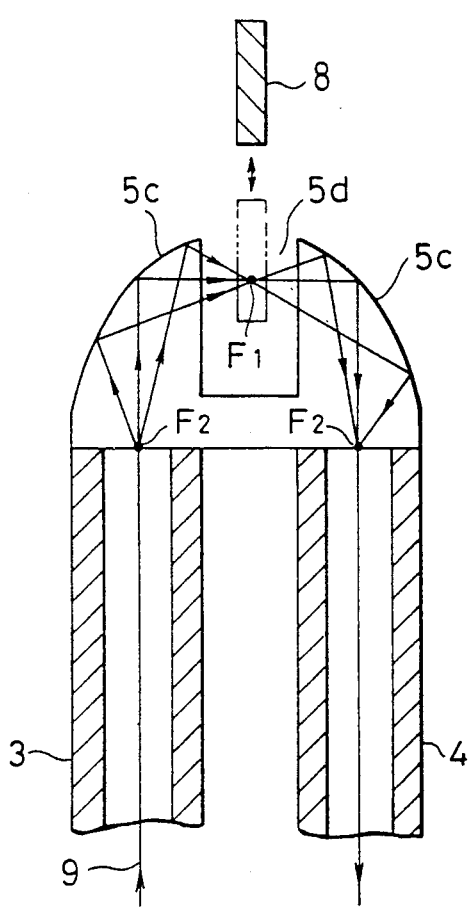
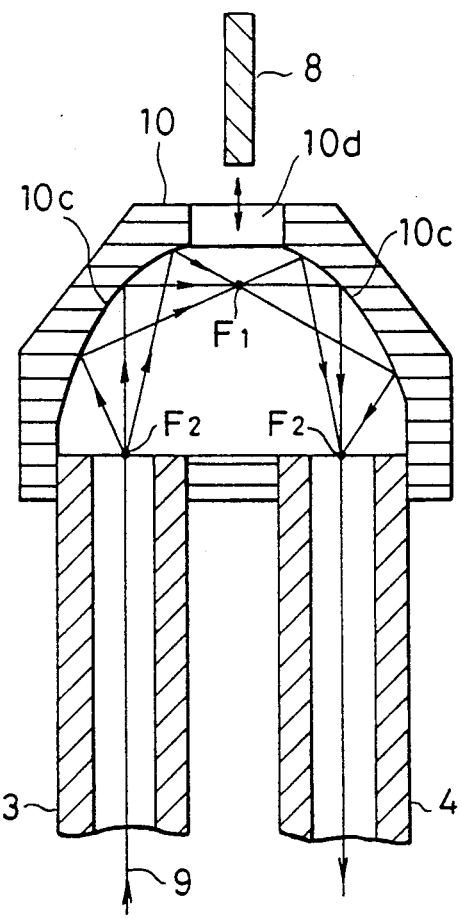
FIG.4  FIG.5
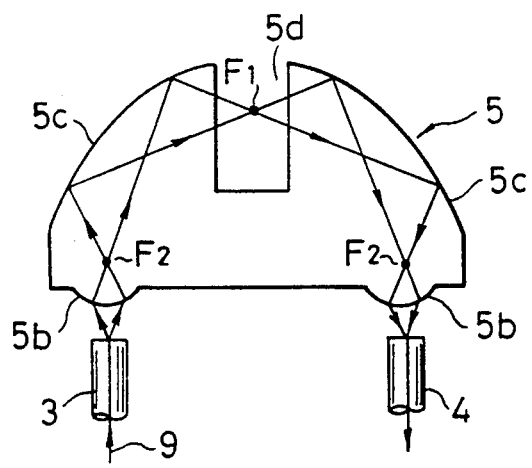
FIG.6

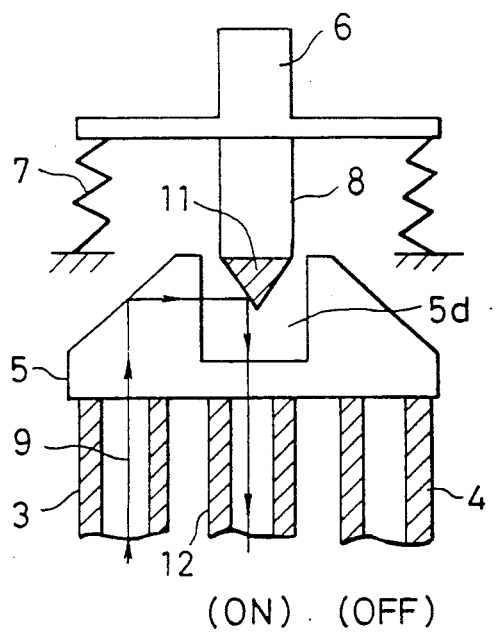 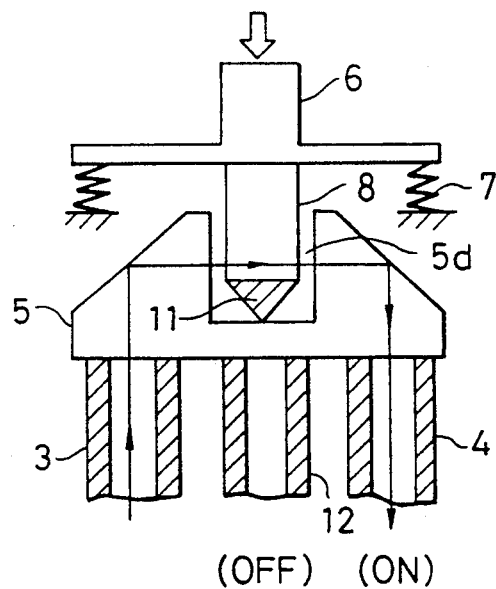
FIG.19  FIG.20
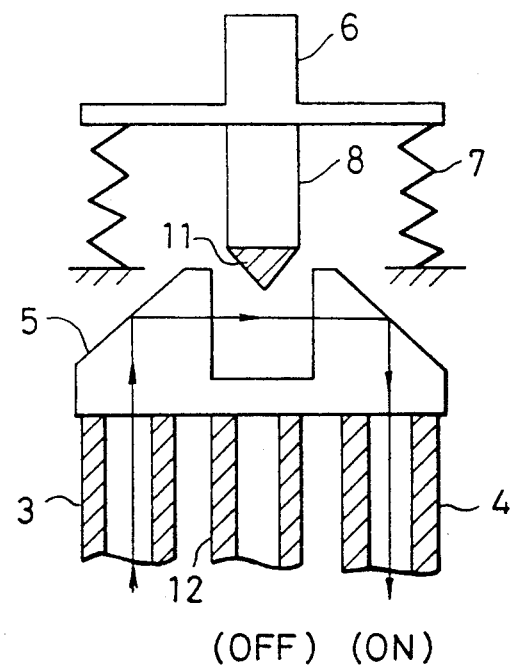 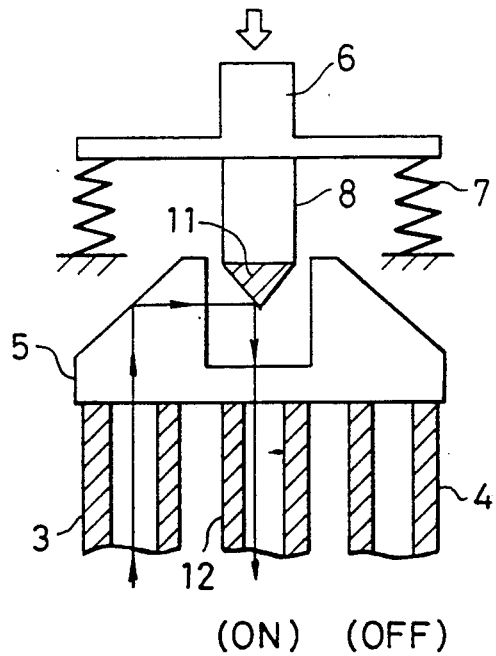
FIG.21  FIG.22

OPTICAL FIBER SWITCH

This application is a continuation of application Ser. No. 456,853, filed Dec. 26, 1989, now abandoned.

BACKGROUND OF THE INVENTION

1. Field of the Invention

The present invention relates to an optical switch connected between a light-emitting optical fiber and a light-receiving optical fiber so as to mechanically turn on and off, according to the operation of an actuator, a light-transmission path formed between the optical fibers.

2. Description of the Prior Art

Optical switches of the type described above are already known. For example, Japanese Laid-open Utility Model Application No. 60-42222 discloses an optical switch of this type. The optical switch described in the publication comprises a prism (a light-conducting member) and a shutter, which are assembled in a housing (a switch casing) of the optical switch. The prism forms a U-shaped light-transmission path between the light-emitting optical fiber and the light-receiving optical fiber. These optical fibers are connected to the optical switch in such a manner that their end faces are aligned. The shutter moves in an air gap midway of the light-transmission path in the prism so as to open and close the light-transmission path according to the operation of an actuator.

The light-conducting prism in the optical switch is provided for guiding the beam entering into the prism from the light-emitting optical fiber toward the end face of the light-receiving optical fiber through the U-shaped light-transmitting path. The prism is provided with an incident area facing the end face of the emitting optical fiber, an emitting area facing the end face of the receiving optical fiber, and two corner-reflecting surfaces. In the middle of these corner reflecting surfaces, the air gap is provided in which the shutter moves up and down.

When the shutter is moved up and is located outside the air gap, the transmission path in the light-conducting prism is opened, and hence, the beam entered into the optical switch from the emitting optical fiber is transmitted to the receiving optical fiber via the light-conducting prism, thus turning the optical switch to the ON state. In contrast, when the shutter is pushed down into the air gap by operating the actuator, the transmission path in the prism is cut off, and the optical switch is turned to the OFF state. The light signal thus transmitted to the receiving optical fiber is transformed into an electric signal by means of a detector including a photodetector and is outputted as an on/off type electric signal.

The beam emitted from the end of an optical fiber disperses at an angle of about 60 degrees with regard to the axis of the optical fiber. Hence, the optical switch described in Japanese Laid-open Utility Model Application No. 60-42222 mentioned above has two opposite spherical corner-reflecting surfaces, one at the emitting side and one at the receiving side of the light-conducting prism incorporated in the optical switch. In this optical switch, the beam entering into the prism from the emitting optical fiber is reflected on a spherical corner-reflecting surface, and is collimated by the surface to some extent. The collimated beam enters the air gap in which the shutter moves up and down, and is transmitted to the opposite corner-reflecting surface; or the beam may be cut off by means of the shutter. The collimated beam transmitted to the opposite corner-reflecting surface is reflected thereon and is transmitted to the receiving optical fiber.

A technique to suppress the dispersion of the beam emitted from the optical fiber, so that the beam from the emitting optical fiber can be transmitted to the receiving optical fiber at a low optical power loss, is disclosed in the optical transmitting apparatus described in Japanese Utility Model Application Publication No. 62-35237. This apparatus incorporates two corner-reflecting prisms and two focusing lenses: each prism has a planar corner-reflecting surfaces which is inclined at an angle of 45 degrees to the horizontal; and the two focusing lenses face the end faces of the emitting and the receiving optical fibers, respectively.

Other optical switches of this type are disclosed, for example, in Japanese Laid-open Patent Application No. 58-89727, and in Japanese Laid-open Utility Model Application No. 60-12217. These switches incorporate a secondary receiving optical fiber in the optical switch in addition to the emitting and receiving optical fibers mentioned above. The optical signal received by the secondary receiving optical fiber can be used to indicate the switching state (ON/OFF) of the optical switch. Japanese Laid-open Patent Application Laying-open No. 58-89727 also discloses a technique to achieve an optical transfer switching function by using the secondary receiving optical fiber.

The optical switches described above, having the light-conducting prism including spherical corner-reflecting surfaces (Japanese Laid-open Utility Model Application No. 60-42222), or having the light-conducting prism including planar corner-reflecting surfaces in conjunction with the two focusing lenses (Japanese Utility Model Application Publication No. 62-35237), can increase the optical transmission efficiency above that of an optical switch having a simple prism including only planar corner-reflecting surfaces, thereby improving the switching function of the optical switch to a certain extent. The optical switches, however, present the following problem:

In the conventional optical switch above, although the beam transmitted across the air gap in the prism in which the shutter moves is converged to a certain extent, the beam is dispersed widely in the air gap. As a result, a large stroke of the shutter is required in order to completely cut off or transmit the beam across the air gap by moving the shutter up and down. To deal with the problem, the optical switch described in Japanese Laid-open Utility Model Application No. 60-42222 is provided with a slit inserted into the input side of the air gap of the prism in which the shutter moves up and down. This slit "converges" the beam to a narrow path along the optical axis. This makes it possible to shorten the stroke of the shutter required to completely cut off or transmit the beam. However, since the slit cuts off the greater part of the beam emitted from the emitting optical fiber, the transmission efficiency between the emitting and the receiving optical fiber is greatly decreased. As a result, stable switching functions become difficult, particularly in an optical circuit using a long optical fiber. Furthermore, when the slit is inserted, the symmetrical construction of the optical switch with regard to emitting and receiving sides thereof cannot be maintained. Thus, polarization of the optical switch results from the mounting position of the slit, which makes the connecting operation of optical fibers to the switch inconvenient under working conditions.

Another technique is disclosed in Japanese Laid-open Utility Model Application No. 61-721. This technique, instead of using a slit for regulating the beam transmitted across the air gap in the prism, uses a shutter having a snap-acting mechanism so that a large moving stroke of the shutter can be obtained by a small operating motion of an actuator. However, the construction incorporating the snap-acting mechanism in the optical switch complicates the inner structure of the optical switch, and increases the cost of the optical switch. Moreover, the friction resulting from the sliding of the actuator and the snap-acting mechanism past each other during the switching operation produces dust which will contaminate the optical components such as the light-conducting member. This will again contribute to the optical power loss. To solve this problem, antidust measures are required.

As mentioned above, other optical switches, having a secondary receiving optical fiber in addition to the emitting and receiving optical fibers, are disclosed in Japanese Laid-Open Patent Application No. 58-89727, and in the Japanese Laid-Open Utility Model Application No. 60-12217. These switches have switch-operation-indicating functions, or work as optical transfer switches similar to a conventional contact-type microswitch provided with a normally-on contact and a normally-off contact.

However, the optical switch described in Japanese Laid-Open Patent Application No. 58-89727 has a low optical transmission efficiency because this optical switch transmits the beam between the emitting optical fiber and the receiving optical fiber by facing the end faces of these fibers directly (or via a reflector), without using a light-conducting member between the fibers. In addition, the alignment of the fibers during the assembly of the optical switch is difficult. Furthermore, the optical fibers may be damaged during assembly because the tips of the fibers must be bent at a particular angle, and hence, undue force may be exerted on the fibers.

On the other hand, the optical switch disclosed in Japanese Laid-Open Utility Model Application No. 60-12217 has three independent cylindrical prisms each of which has an oblique reflecting surface at the top. One of the prisms is connected to an emitting optical fiber, and the other two prisms are connected to two receiving optical fibers, respectively. The two receiving prisms obliquely face the emitting prism so as to receive the light from the emitting optical fiber, and transmit the light to each receiving optical fiber. In such a configuration, not only the decrease of the optical transmission efficiency between the fibers cannot be avoided, but also the position adjustment of the prisms during the assembly is difficult.

SUMMARY OF THE INVENTION

It is therefore a primary object of the invention to provide an optical switch which can transmit the beam emitted from the emitting optical fiber to the receiving optical fiber with high optical transmission efficiency by reducing the dispersion and leakage of the beam.

It is a second object of the invention to provide an optical switch that can shorten the stroke of the shutter during switching by focusing the beam at one point in the air gap in which the shutter moves up and down.

It is a third object of the invention to provide an optical switch that has a switch-operation-indicating function or an optical transfer-switching function in conjunction with the functions of the above objects.

To accomplish the objects above, the present invention comprises lensing means provided on the entering area and the emitting area of the light-conducting means in such a manner that the lensing means face the end face of the emitting optical fiber and the end face of the receiving optical fiber, respectively. This makes it possible to improve the transmission efficiency of the beam emitted from the emitting optical fiber and transmitted to the receiving optical fiber. In addition, the lens system consisting of the light-conducting member is designed so that the beam is focused at one point in the air gap in which the shutter moves. This makes it possible for the shutter to turn the beam on and off by moving through a very small distance, thereby simplifying the switching mechanism by omitting the complicated snap-acting mechanism of the prior art for amplifying the stroke of the shutter.

Furthermore, corner-reflecting surfaces of a light-conducting member are made spherical or elliptical, in addition to the above configuration wherein focusing lenses are formed at the incident area and the emitting area of the light-conducting member in such a way that the focusing lenses face end faces of an emitting optical fiber and a receiving optical fiber, respectively.

With regard to the light-conducting member having elliptical corner-reflecting surfaces, it is effective to adjust the first focal points of the elliptical corner surfaces to the focusing point of the beam in an air gap in which a shutter moves in order to focus the beam emitted from the emitting optical fiber at the focusing point. Moreover, adjusting the second focal points of the elliptical corner surfaces to the end faces of the emitting optical fiber and the receiving optical fiber, respectively, makes it possible to omit the focusing lenses. Furthermore, a concave reflecting mirror can be used as the light-conductive member instead of the prism.

In addition, it is preferable that the light-conducting prism be provided with spherical surfaces separating the light-conducting prism and the air gap in which the shutter moves, in such a way that the center of the spherical surfaces is positioned at the light-focusing point in the air gap. This makes it possible for the beam to be focused at the focusing point in the air gap without being adversely affected by the refraction of the prism.

Furthermore, it is preferable that surface areas of the light-conducting prism excluding light-transmitting surface areas and light-reflecting surface areas along a light-transmitting path between the emitting optical fiber and the receiving optical fiber be low-reflectance surfaces. This makes it possible to prevent degradation of the switching function resulting from stray light in the optical system of the optical switch.

To maintain the correct connecting positions of the emitting and receiving optical fibers, and thereby maintain a high optical-transmission efficiency, tapered insertion holes, having a polygonal cross section at the inner part thereof, can be used to firmly hold the optical fibers. In addition, in order to prevent a displacement or disconnection of the optical fibers during use, it is preferable to use a terminal base with a quick-connect type holder engaged with the terminal base.

A push-button type actuator, directly connected to the shutter, can be used in conjunction with a coil spring for returning the actuator to the normal position: the actuator and the coil spring are incorporated in a housing, and the shutter can be moved without mechanical sliding or friction. This arrangement makes it possible to greatly decrease the amount of dust which would be produced by sliding and friction during the operation of a conventional actuator. This arrangement also simplifies the construction of the switch-operating mechanism.

To achieve the third object of the present invention, the optical switch has a reflecting means as well as a secondary receiving optical fiber: the reflecting means is provided at the tip of the shutter means for reflecting the beam emitted from the emitting optical fiber so as to incline the beam by approximately 90 degrees in the air gap of the light-conducting means; and the secondary receiving optical fiber which is provided in addition to the other receiving optical fiber is aligned with the traveling path of the inclined beam so as to receive it.

To achieve an optical switch having a high optical transmission efficiency and a wide dynamic range, or to maintain a firm connection to the optical fiber, or to prevent the production of dust during switching, the following techniques mentioned above can also be used: providing corner-reflecting surfaces of the light-conducting members which are spherical or elliptical; providing the light-conducting prism with focusing lenses opposite the end faces of optical fibers including the secondary receiving optical fiber; providing the light-conducting prism with spherical surfaces separating the light-conducting prism and the air gap in which the shutter moves, in such a way that the center of the spherical surfaces is positioned at the light-focusing point in the air gap; making surface areas of the light-conducting prism low-reflectance surfaces, excluding light transmitting surface areas and light-reflecting surface areas along the light-transmission path between the emitting optical fiber and the receiving optical fiber; providing the light-conducting prism with tapered insertion holes having a polygonal cross section at the inner part thereof; using a terminal base with a quick-connect type holder engaged to the terminal base; or using a push-button type actuator directly connected to the shutter with a coil spring for returning the actuator to the normal position, the actuator and the coil spring being incorporated in a housing.

Moreover, to present a bidirectional optical switch of this type, a reflecting means, having two reflecting surfaces symmetrically formed on either side of the tip of the shutter, is provided at the tip of the shutter.

Furthermore, to guide the beam inclined at the reflecting surface at the tip of the shutter to the secondary receiving optical fiber with a low power loss, the reflecting surface at the tip of the shutter should be a planar surface when the corner-reflecting surfaces of the light-conducting member are spherical; whereas the reflecting surface at the tip of the shutter should be parabolic, when the corner-reflecting surfaces of the light-conducting member are elliptical.

Finally, to maintain the optical power entering the secondary receiving optical fiber at a constant level, it is preferable that the reflecting surface provided at the tip of the shutter have a terraced surface.

The optical switch thus constructed can transmit a beam with high efficiency: the beam entering into the optical switch from the emitting optical fiber is transmitted to the receiving optical fiber through the light-conducting member consisting of the prism or the concave reflecting mirror, without leakage to the outside of the optical system. In addition, since almost all the beam transmitted through the light-conducting member is focused at one point in the air gap in which the shutter moves, only a small stroke of the shutter is sufficient to completely transmit or stop the beam, thus switching the beam on and off at a high efficiency. Furthermore, since the light-conducting member has an optically symmetrical configuration with regard to the entering and emitting sides of the beam, a bidirectional optical switch can be obtained which has no polarity, and hence, can be used without regard to polarity.

In the optical switch having a reflecting surface at the tip of the shutter for inclining the beam, as well as having a secondary receiving optical fiber aligned with the path of the inclined beam, the beam is switched to be transmitted to the primary receiving optical fiber or to the secondary receiving optical fiber according to the position of the shutter: on the one hand, the beam emitted from the emitting optical fiber passes across the air gap of the light-conducting member, and is transmitted to the primary receiving optical fiber; on the other hand, the beam emitted from the emitting optical fiber is reflected on the reflecting surface of the shutter so as to be inclined, thus entering the secondary receiving optical fiber. As a result, the ON/OFF state of the optical switch can be indicated by guiding the beam transmitted through the secondary receiving optical fiber to an indicator as a monitor signal. Otherwise, a transfer-type optical switch can be achieved similar to a conventional contact-type switch having a normally-on contact and a normally-off contact, by using the secondary receiving optical fiber as well as the primary receiving optical fiber as switching circuits.

This type of optical switch can be made bidirectional by providing two symmetric reflecting surfaces at the tip of the shutter. The focusing lens opposite the secondary receiving optical fiber functions so as to focus the inclined beam by the reflecting surface of the shutter onto the end face of the secondary receiving optical fiber. Thus, the beam can be transmitted to the secondary receiving optical fiber with high transmission efficiency. This is particularly true when the corner-reflecting surfaces are spherical and the reflecting surfaces at the tip of the shutter are planar, or when the corner-reflecting surfaces are elliptical and the reflecting surfaces at the tip of the shutter are parabolic.

The terraced reflecting surface at the tip of the shutter guides the reflected and inclined beam to the secondary receiving optical fiber with little loss of power even if the stroke position of the shutter is displaced by a small amount.

The tapered optical-fiber insertion holes provided in the light-conducting prism and having a polygonal cross section at the inner part thereof make it possible for the optical fibers to be firmly connected at the correct positions of the light-conducting prism while compensating for errors of the diameter of the optical fibers within given tolerances. The holder, combined with the terminal base of the housing, fastens the optical fibers in place by quick-operation, and prevents the displacement or disconnection of the optical fibers while in use. The operating mechanism, having the push-button-type actuator urged by the returning coil spring, and having the shutter directly connected to the actuator, has no mechanical sliding portion, and hence, no dust will be produced during the switching operation.

The surfaces separating the surface areas of the light-conducting prism and the air gap in which the shutter moves are a spherical surface whose center is located at the focusing point in the air gap. This makes it possible for the beam, which is transmitted from the surface area of the prism into the air gap so as to be focused at the focusing point, to be normally incident to the surface area of the prism. As a result, the entirety of the beam is focused at the focusing point without being adversely affected by the refraction of the prism.

Finally, the surface areas other than those along the correct optical transmission path are frosted, or coated with a reflection-reducing film, so as to be of a low-reflectance. This makes it possible for stray light, which repeatedly reflects between the shutter at the blocking position and the surfaces of the light-conducting prism during the travel to the receiving optical fiber, to be absorbed and attenuated by means of the low-reflectance surfaces while traveling. Hence, misoperation of the optical switch caused by stray light can be avoided.

BRIEF DESCRIPTION OF THE DRAWINGS

FIG. 4 is a cross-sectional view showing the light-transmission path in a light-conducting prism having elliptical corner-reflecting surfaces;

FIG. 5 is a cross-sectional view showing the light-transmission path in a concave-mirror type light-conducting member having elliptical corner-reflecting surfaces;

FIG. 6 is a diagrammatic view showing the light-transmission path in a light-conducting prism having elliptical corner-reflecting surfaces and focusing lenses;

FIG. 19 and FIG. 20 are cross-sectional views showing the switching operation of the optical switch in FIG. 18;

FIG. 21 and FIG. 22 are cross-sectional views showing the switching operation of a modified optical switch corresponding to the optical switch in FIG. 18;

DESCRIPTION OF THE PREFERRED EMBODIMENTS

The invention will now be described with reference to the accompanying drawings.

Figure 1:
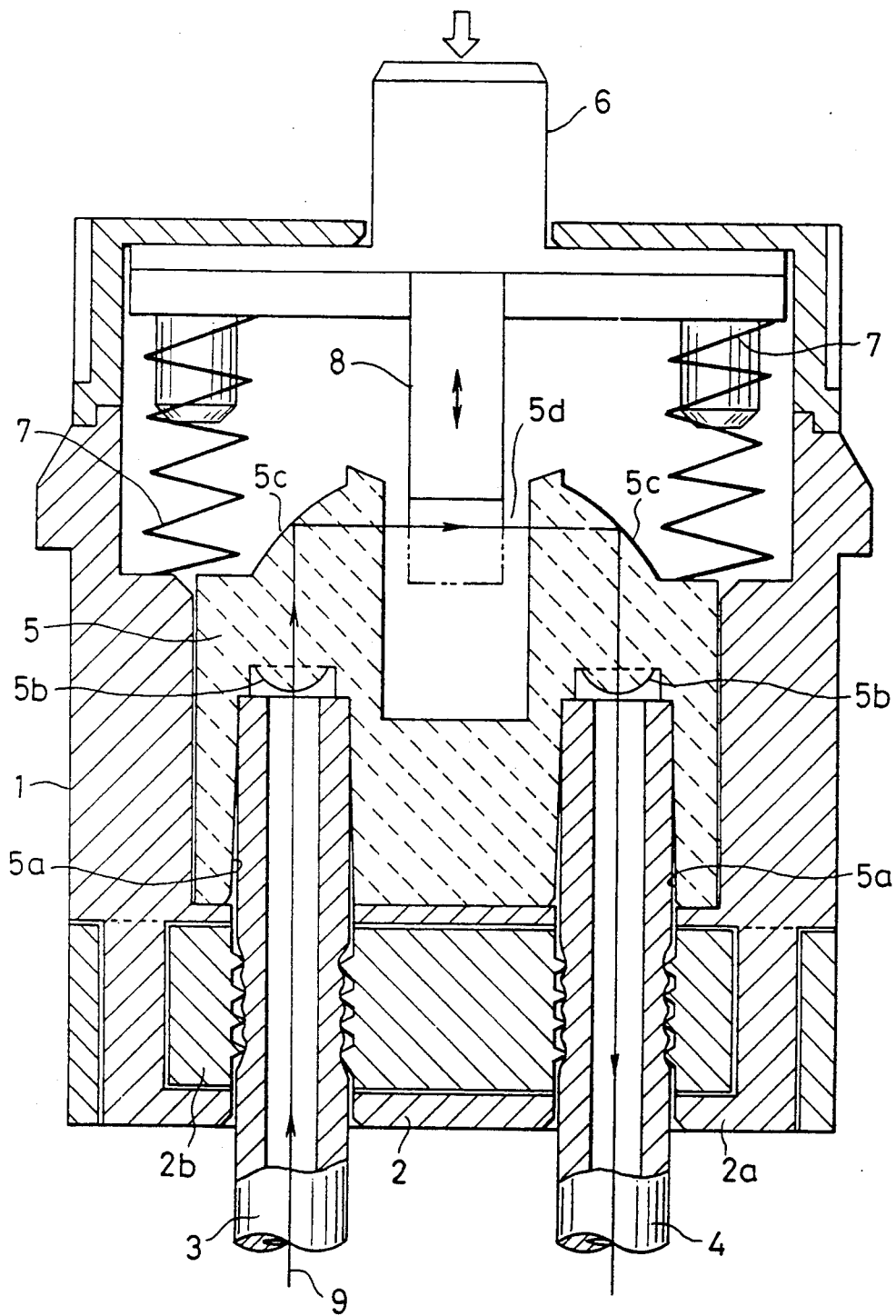
FIG. 1 is a cross-sectional view showing the inner structure of the optical switch of an embodiment of the present invention.

FIG. 1 shows a basic structure of an embodiment of the present invention. In FIG. 1, numeral 1 designates a housing or switch-case. To the housing 1 is attached a terminal base 2 to which an emitting optical fiber 3 and a receiving optical fiber 4 are connected in such a manner that respective end faces of emitting optical fiber 3 and receiving optical fiber 4 are in alignment. In the housing 1, the following components that constitute the optical switch are provided: a light-conducting prism 5 that forms an optical transmission path for guiding a beam from the emitting optical fiber 3 to the receiving optical fiber 4; a push-button type actuator 6 whose one end protrudes outward from an upper lid of the housing 1; coil spring 7 for returning the actuator 6 to the normal position; and a shutter 8 directly attached to the actuator 6.

The light-conducting prism 5, for example, is made of a molded transparent resin, and is provided with the following parts: at the bottom thereof, optical-fiber-insertion holes 5a for inserting the optical fibers 3 and 4 are provided; at the innermost ends of the optical-fiber-insertion holes 5a, convex focusing lenses 5b are provided so as to face the end faces of the optical fibers 3 and 4, respectively, apart by narrow gaps; at the upper corners of the light-conducting prism 5, corner-reflecting surfaces 5c of spherical or elliptical surface are provided (this will be described later); and at the center of the top of the light-conducting prism 5, an air gap 5d is formed so that the shutter 8 can be moved therealong. Thus, a U-shaped optical-transmission path is formed between the emitting optical fiber 3 and receiving optical fiber 4.

The optical switch thus constructed operates as follows: FIG. 1 shows an ON state of the optical switch: the shutter 8 is in the normal position in which the shutter 8 is placed above the air gap 5d of the light-conducting prism 5. A beam 9 or an optical signal emitted from the emitting optical fiber 3 passes through the focusing lens 5b, and enters the light-conducting prism 5. Then, the beam 9 is reflected at the left corner-reflecting surface 5c, passes across the air gap 5d at the center, is reflected at the right corner-reflecting surface 5c, and reaches the end of receiving optical fiber 4. Incidentally, the actuator 6 is pushed up by means of the coil spring 7 in this case.

On the other hand, when the actuator 6 is pushed down against the coil spring 7, the shutter 8 directly connected to the actuator 6 is inserted into the air gap 5d of the light-conducting prism 5 as shown by the alternate-long-and-short-dashed line in FIG. 1, so that the shutter 8 cuts off the beam 9 transmitted across the air gap 5d. Thus, the optical signal does not reach the receiving optical fiber 4, and hence the optical switch is changed into the OFF state.

Although the optical switch above is a normally-on switch, a normally-off switch can also be constructed. For example, an opening for passing beam 9 is provided at the middle of the shutter 8, and the shutter 8 is positioned so that it cuts off the beam 9 in the normal position. When the actuator 6 is pushed down, the shutter 8 moves down and transmits the beam 9 through the opening.

The transmission path of the beam 9 in the light-conducting prism 5, which is a major element of the optical switch will now be described.

Figures 2, 3:
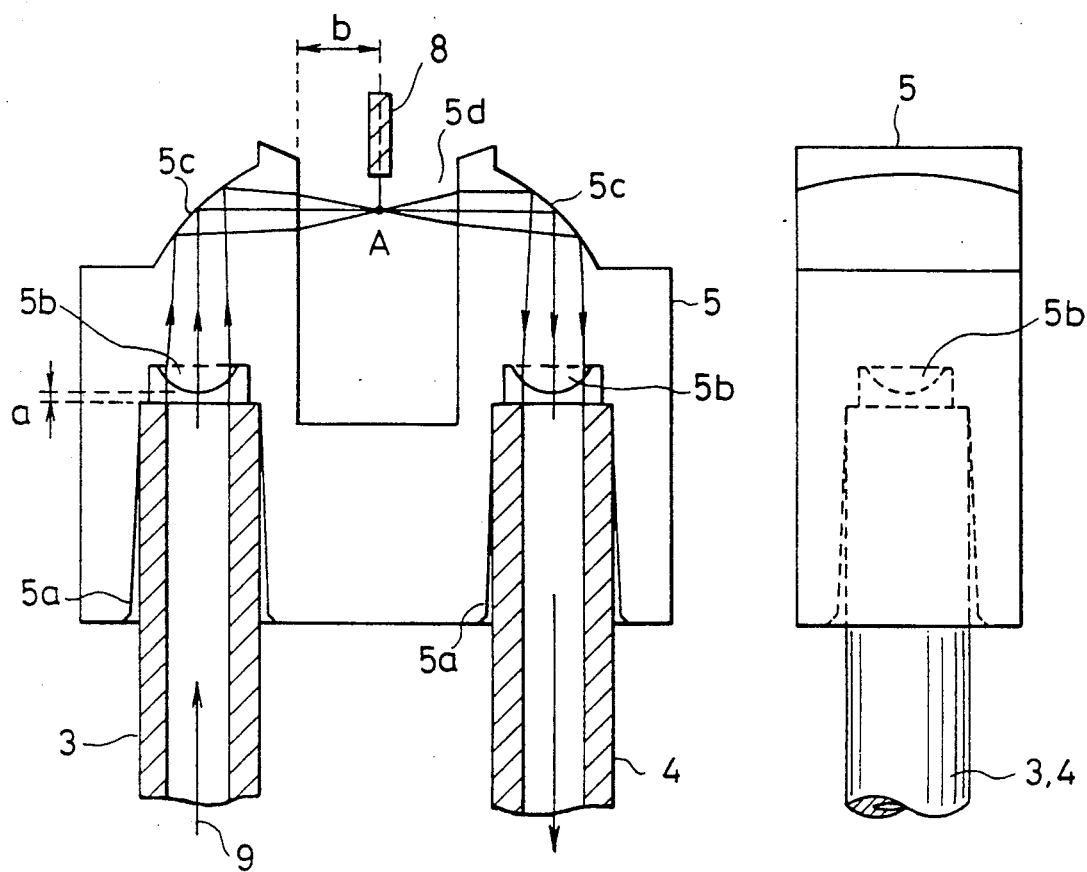
FIG. 2 is a cross-sectional view showing the light-transmission path in a light-conducting prism having spherical corner-reflecting surfaces.
FIG. 3 is a side view of the light-conducting prism shown in FIG. 2.
Figure 7:
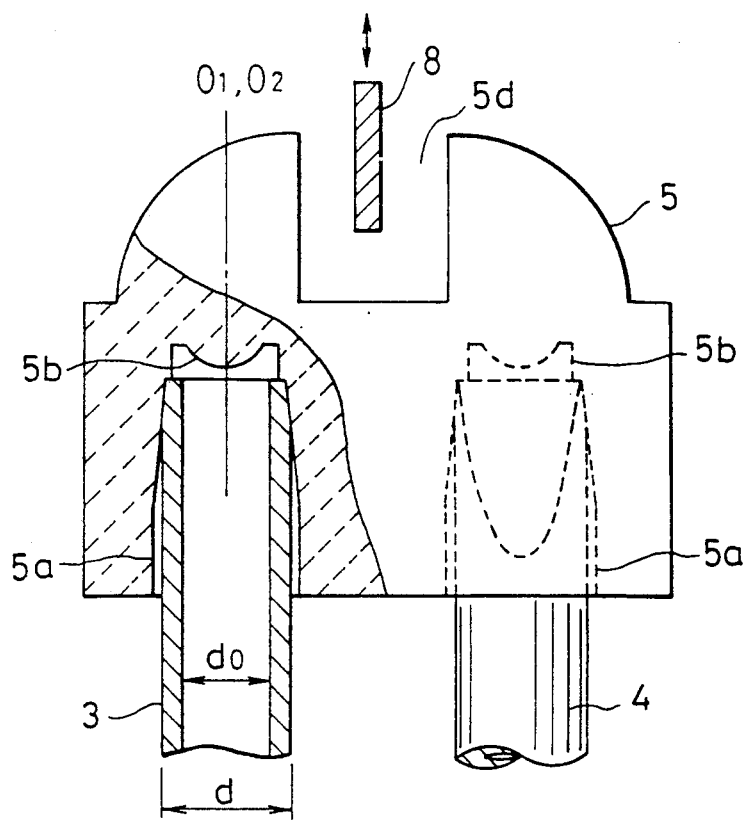
FIG. 7 is a cross-sectional view showing the connecting construction between the light-conducting prism and the optical fibers shown in FIG. 1.
Figures 8, 9, 10:
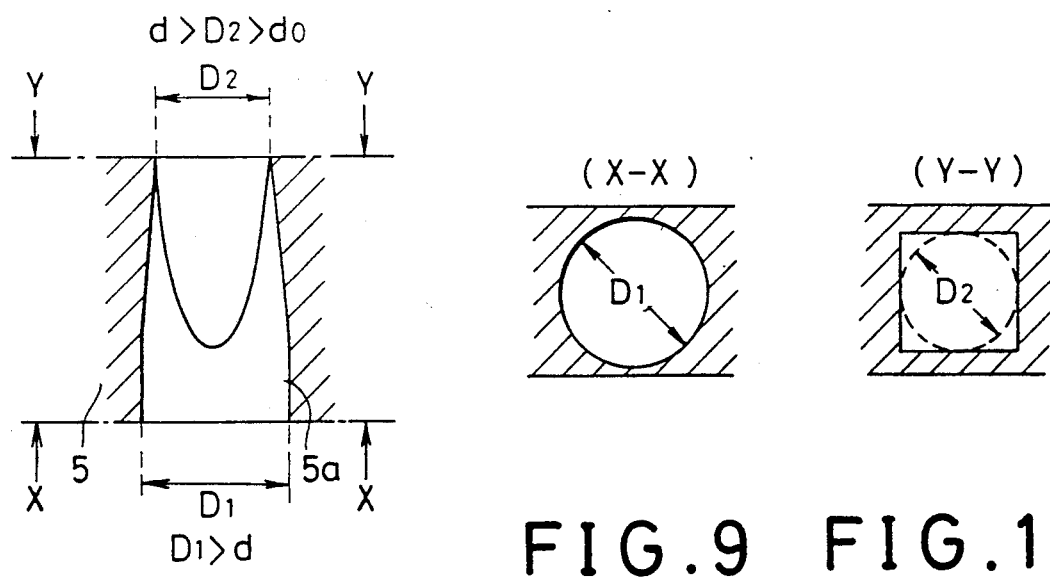
FIG. 8 is a longitudinal sectional view showing the shape of an insertion hole for the optical fiber.
FIG. 9 is a transverse sectional view taken along the line X—X of FIG. 8.
FIG. 10 is a transverse sectional view taken along the line Y—Y of FIG. 8.

FIG. 2 and FIG. 3 show the transmission path in the light-conducting prism 5. The light-conducting prism 5 has spherical corner-reflecting surfaces 5c. The beam 9 emitted from the end of emitting optical fiber 3 at a dispersion angle of about 60 degrees is converged through the focusing lens 5b formed at the entering area on the light-conducting prism 5 so as to compensate for the dispersion. Then, the beam 9 is reflected at the central area of the left corner-reflecting surface 5c, and is focused at the point A at the center of the air gap 5d. Almost all the beam 9 can be focused at the point A in the air gap 5d under the following conditions: first, the light-conducting prism 5, including the focusing lenses 5b and spherical corner-reflecting surfaces 5c, is considered as a one-lens system as a whole; second, the light-conducting prism 5 is designed so that the following equation is satisfied:

$$1/a + 1/b = 1/f$$

where:
a = object distance (a>0);
b = image distance (b>0); and
f = focal length of the lens system.

Each end face of the emitting optical fibers 3 and 4 is separated from each focusing lens 5b so that a gap is formed therebetween. As a result, in the case where the optical fibers are connected to the optical switch, the end faces of the optical fibers are separated from the surface of the prism made of resin, and hence, damage of the prism caused by friction between the prism and optical fibers can be avoided.

As described above, the beam 9 sent into the optical switch from the emitting optical fiber 3 is focused at the point A in the air gap 5d in which the shutter 8 moves. Hence, a slight movement of the shutter 8 is sufficient to turn the optical switch on and off: the beam 9 is completely transmitted when the shutter 8 is in the normal position, and is completely cut off when the shutter 8 is pushed down slightly. This makes it possible for the switching mechanism shown in FIG. 1 to perfectly control the beam 9. In other words, this makes it unnecessary to use a complicated snap-acting mechanism for amplifying the movement of the actuator 6 so as to reciprocate the shutter 8 with a large stroke, and hence the shutter 8 can be attached directly to the push-button type actuator 6. Thus, an optical switch of a simple and compact structure can be constructed. In addition, the construction shown in FIG. 1 has no mechanical portion causing friction because the actuator 6 is supported by means of the coil spring 7 in the housing 1. As a result, the movement of the actuator 6 does not produce dust which causes contamination of the optical components in the optical switch, thus maintaining a good operation.

Furthermore, since the light-conducting prism 5, acting as a light-conducting member, has an optically symmetric structure with respect to the input and output of the beam 9, the same switching operation can be achieved even if the connecting positions of emitting optical fiber 3 and receiving optical fiber 4 are exchanged. Consequently, the optical switch functions as a bidirectional switch. This makes it unnecessary to specify the polarity of the switch, and facilitates the fiber-connecting operation.

In the above description, the corner-reflecting surfaces 5c for focusing the beam 9 onto the point A in the air gap 5d provided at the center of light-conducting prism 5 (which is a light-conducting member) have a spherical surface. However, the corner-reflecting surfaces 5c can have an elliptical surface.

FIG. 4, FIG. 5, and FIG. 6 show embodiments having corner-reflecting surfaces 5c of an elliptical surface. In FIG. 4, the light-conducting member is made of light-conducting prism 5, and the left and right corner-reflecting surfaces 5c, i.e., the input side and output side corner-reflecting surfaces 5c are of an elliptical surface. Each corner-reflecting surface 5c is made so that the two focal points F1 and F2 are positioned as follows: first, the focal point F1 is adjusted so that it agrees with the center of the air gap 5d provided at the center of the light-conducting prism 5 (this point corresponds to the focusing point A in FIG. 2); second, the focal point F2 is adjusted so that it agrees with the center of the end face of emitting optical fiber 3 or receiving optical fiber 4.

According to the configuration above, the beam 9, emitted from the end of emitting optical fiber 3 corresponding to the focal point F2, is reflected at the corner-reflecting surface 5c, and is focused at the focal point F1 in the air gap 5d. After that, the beam 9 is reflected at the right corner-reflecting surface 5c, and is focused onto the focal point F2 which corresponds to the end of receiving optical fiber 4. Thus, the entire beam 9 emitted from the emitting optical fiber 3 is transmitted to the receiving optical fiber 4 without leakage to the outside. In addition, since the beam 9 is focused at the focal point F1, which corresponds to the center of the air gap 5d in which the shutter 8 moves, a slight movement of the shutter 8 is sufficient to switch the beam 9 on and off.

FIG. 5 shows another embodiment which uses a concave reflector 10 instead of the light-conducting prism 5 described above. The concave reflector 10 has a reflective inner surface, and comprises the following members: at the bottom left of the concave reflector 10, an insertion hole for inserting emitting optical fiber 3 is formed; at the bottom right of the concave reflector 10, an insertion hole for inserting receiving optical fiber 4 is formed; at the left and right corners of the inner surface of the concave reflector 10, elliptical corner-reflecting surfaces 10c are formed; and at the center of the top of concave reflector 10 is formed an air gap 10d in which the shutter 8 moves up and down. The focal points F1 and F2 of the elliptical surfaces of corner-reflecting surfaces 10c are positioned in similar locations to those of corner-reflecting surfaces 5c of the embodiment shown in FIG. 4.

FIG. 6 shows a variation of the embodiment shown in FIG. 4. In this variation, the light-conducting prism 5 has two focusing lenses 5b: one is formed opposite the light-emitting end of emitting optical fiber 3; and the other is formed opposite the light-accepting end of receiving optical fiber 4. Each focal point of the focusing lenses 5b is designed so as to agree with the second focal point F2 of elliptical corner-reflecting surfaces 5c, as shown in FIG. 6. As a result, the beam 9 emitted from the end of the emitting optical fiber 3 is focused at the focal point F2 of the elliptical surface through the focusing lens 5b, is reflected at the corner-reflecting surface 5c, and is focused at the focal point F1 in the air gap 5d.

The detailed structure of the optical-fiber-insertion holes 5a of light-conducting prism 5 shown in FIG. 1 will now be described with reference to FIG. 7 to FIG. 10 and FIG. 33.

Figure 33:
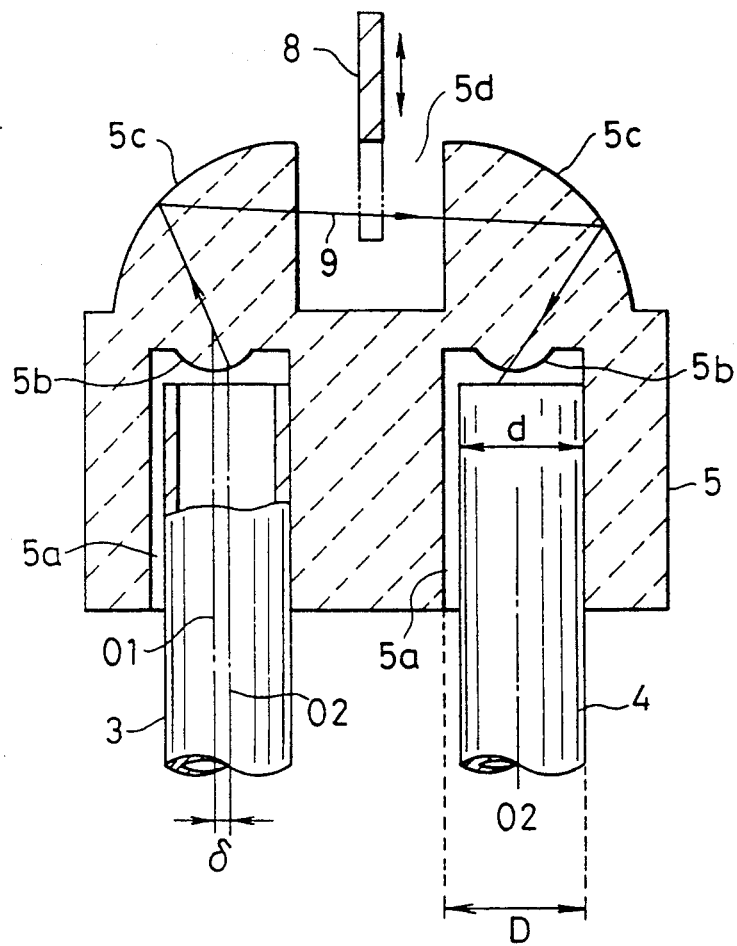
FIG. 33 is a cross-sectional view showing unimproved insertion holes of optical fibers of an embodiment corresponding to the improved insertion holes of the embodiment shown in FIG. 7.

FIG. 33 shows a construction of an embodiment of the present invention. As shown in FIG. 33, the optical fibers are connected to the optical switch by means of the optical-fiber-insertion holes 5a provided on the left and right side of the bottom surface of the light-conducting prism 5: the emitting optical fiber 3 and receiving optical fiber 4 are inserted, positioned, and fixed into the optical-fiber-insertion holes 5a, respectively. In FIG. 33, the difference between the inner diameter D of the optical-fiber-insertion holes 5a and the outer diameter d of the emitting and receiving optical fibers is exaggerated to better show the problem in the embodiment.

In this construction, the optical-fiber-insertion hole 5a provided in the light-conducting prism 5 is a cylindrical hole whose inner diameter D is specified to match the outer diameter d of the optical fibers 3 and 4. The outer diameter d of the optical fibers varies somewhat within a tolerance, and hence the inner diameter D of the optical-fiber-insertion hole 5a must be specified to the maximum diameter allowed by the tolerance so that the optical fiber can be inserted into the optical-fiber-insertion holes 5a.

Specifying the inner diameter D of the optical-fiber-insertion hole 5a as being equal to the maximum diameter allowed by the tolerance, however, presents the following problems: if the outer diameter d of the optical fiber is equal to the maximum diameter allowed by the tolerance, insertion of the optical fiber into the optical-fiber-insertion hole 5a is difficult because there is no clearance between the optical fiber and the optical-fiber-insertion holes 5a; on the other hand, if the outer diameter d of the optical fiber is less than the maximum diameter allowed by the tolerance, the optical fiber is inserted into the light-conducting prism 5 with a clearance fit, leaving a clearance between the light-conducting prism 5 and the circumference of the optical fiber. As a result, the radial position of the optical fiber cannot be specified, and the optical axis O1 of the focusing lens 5b formed at the innermost end of the optical-fiber-insertion hole 5a may not align with the center line O2 of the optical fiber (the difference between the two is represented by δ). This may cause an undesirable situation wherein the transmission path of the beam 9 in the light-conducting prism 5 between the emitting optical fiber 3 and receiving optical fiber 4 varies depending on the connecting state of the optical fibers.

In contrast, in the improved embodiments shown in FIG. 7 to FIG. 10, the optical-fiber-insertion holes 5a are formed as follows: first, the diameter D1 at the entrance of the optical-fiber-insertion hole 5a is made slightly greater than the maximum value of the outer diameter d of the optical fibers 3 and 4 specified by the tolerance; second, the diameter D2 of the inscribed circle in the innermost square of the optical-fiber-insertion hole 5a is made slightly smaller than the minimum diameter of the optical fibers 3 and 4 allowed by the tolerance; and third, the optical-fiber-insertion hole 5a is tapered towards the innermost end, forming the inner wall whose cross sections changing from a circle to a square at the middle of the optical-fiber-insertion hole 5a. The diameter D2 above is specified to be greater than the core diameter d0 of the optical fiber, and hence, $d > D2 > d0$. The core diameter d0 is defined as the diameter of the core of the optical fiber which is covered with a sheath made of a flexible resin.

According to the construction described above, when the optical fibers 3 and 4 are inserted into the innermost end of the optical-fiber-insertion holes 5a of the light-conducting prism 5, the sheath at each tip of the optical fibers 3 and 4 is pushed into the optical-fiber-insertion hole 5a and is slightly depressed. Thus, the optical fibers are connected to the optical-fiber-insertion hole 5a with an interference fit. Parts of the sheath protruded by the depression are contained in the four innermost corners of the tapered optical-fiber-insertion hole 5a whose cross section is a square. As described above, the diameter D1 at the entrance of the optical-fiber-insertion hole 5a is greater than the outer diameter d of the optical fiber. This facilitates the inserting operation of the optical fibers into the optical-fiber-insertion holes 5a, making it easier to carry out the connecting operation of the optical fibers to the light-conducting prism 5 under working conditions.

It will be clear from the above description that the optical fibers 3 and 4 fit tightly into the optical-fiber-insertion holes 5a, and that the center line O2 of each end of the optical fibers 3 and 4 are aligned with the optical axis O1 of the focusing lens 5b formed on the light-conducting prism 5. Thus, the optical fibers 3 and 4 are positioned at the correct locations and are firmly held. In addition, the optical fibers 3 and 4 can always be positioned correctly as long as the outer diameters d of the optical fibers are within the tolerance. This not only increases the optical transmission rate, but also stabilizes the switching operation of the optical switch.

In the embodiment shown in FIG. 7 to FIG. 10, although the optical-fiber-insertion holes 5a have a square cross section at the inner part thereof, it is not limited to a square. The cross section of an equilateral triangle, an equilateral pentagon, or any other equilateral polygon can achieve an effect similar to that described above.

Figure 11:
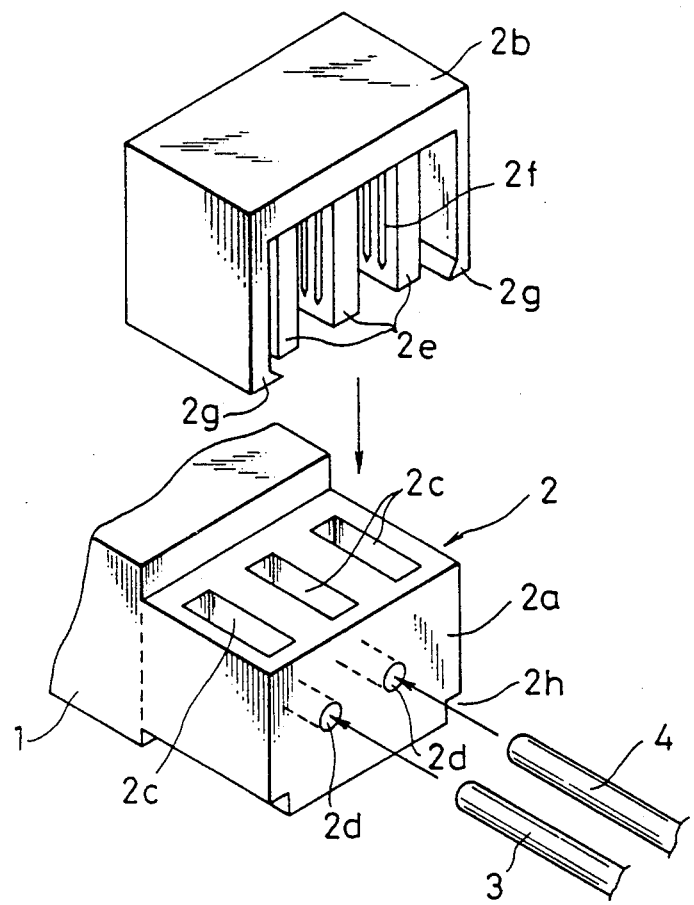
FIG. 11 is an exploded perspective view showing the construction of the terminal base in FIG. 1.
Figure 12:
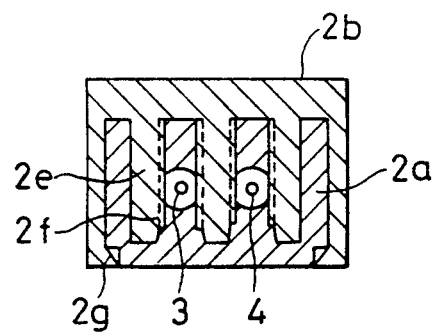
FIG. 12 is a cross-sectional view of the assembled terminal base corresponding to the terminal base shown in FIG. 11.

FIGS. 11 and 12 show a detailed construction of the terminal base 2 for connecting the optical fibers. The terminal base 2 has a base 2a, and a holder 2b to be fitted to the base 2a. The base 2a has three holes 2c opening upwards and two guide holes 2d for inserting optical fibers. The two guide holes 2d are provided through the base 2a so as to guide the optical fibers from the front to the back of the base 2a, with either side of the guide holes 2d opening to the holes 2c. On the other hand, the holder 2b has three legs 2e, each of which is fitted into a hole 2c. These legs 2e are unitarily formed with a frame that forms the upper surface and both sides of the base 2a. On each side of the leg 2e, a plurality of rib-like projections 2f are provided in a vertical direction. Each rib-like projection 2f has a tip having a wedge-shaped cross section.

Next, the connecting operation of the optical fibers 3 and 4 to the terminal base 2 will be described. First, each of the optical fibers 3 and 4 is inserted to one of the guide holes 2d of the base 2a from the front, and each is inserted until the tip of the optical fiber reaches the innermost end of the optical-fiber-insertion hole 5a of the light-conducting prism 5 shown in FIG. 7. Second, the holder 2b is fitted to the base 2a from the top thereof: after the legs 2e are inserted into the holes 2c of the base 2a, the holder 2b is pushed into the base 2a. Then, the optical fibers already inserted into the guide holes 2d are held between the legs 2e so that the rib-like projections 2f cut into the sheaths (covers made of flexible resins) of the optical fibers 3 and 4 in the perpendicular direction of the optical fibers. When the holder 2b is entirely pushed down into the base 2a, engaging projections 2g, provided at the side ends of the frame of the holder 2b, are engaged to notch 2h of the base 2a so that they are fastened to each other.

Thus, the rib-like projections 2f cut into the optical fibers 3 and 4, firmly holding them in the connecting position. Hence, the optical fibers 3 and 4 cannot be displaced easily by an external force. Furthermore, the connecting operation of the optical fibers to the optical switch can be achieved by a quick-connecting operation by engaging the holder 2b to the base 2a.

Figure 13:
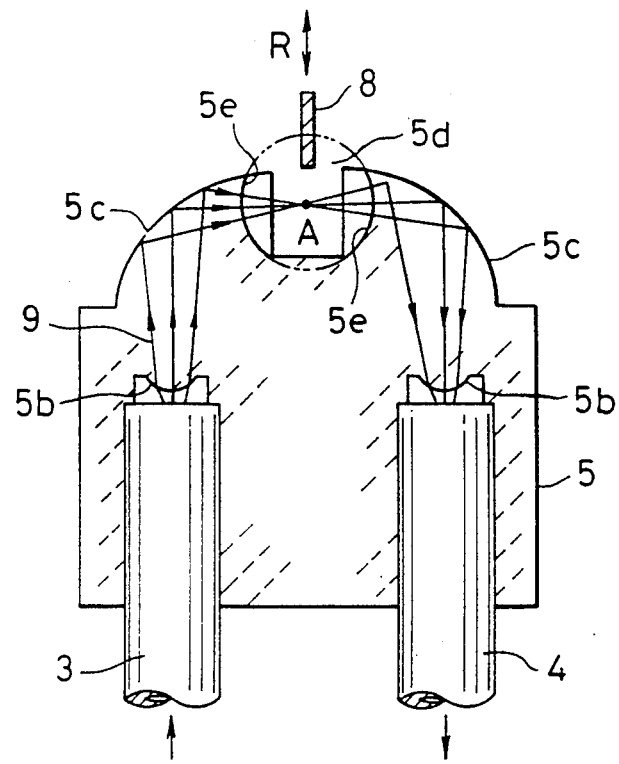
FIG. 13 is a cross-sectional view showing an improved light-conducting prism corresponding to the prism of the embodiment in FIG. 2.
Figure 14:
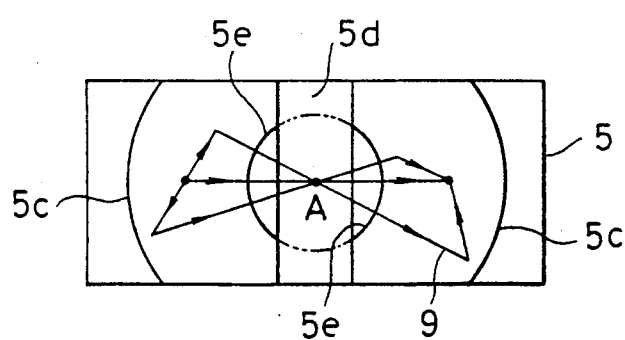
FIG. 14 is a plan view of the improved light-conducting prism in FIG. 13.

FIGS. 13 and 14, and FIGS. 15 and 16 show respective improved light-conducting prism 5 in FIG. 1. The improvement is carried out to increase the beam transmission efficiency between the optical fibers 3 and 4. In FIGS. 13 and 14, the light-conducting prism 5 has spherical corner-reflecting surfaces 5c and focusing lenses 5b facing the end faces of the emitting optical fiber 3 and receiving optical fiber 4. In contrast, in FIGS. 15 and 16, the light-conducting prism 5 has elliptical corner-reflecting surfaces 5c, but has no focusing lens 5b facing the end faces of the emitting optical fiber 3 and receiving optical fiber 4.

Figure 34:
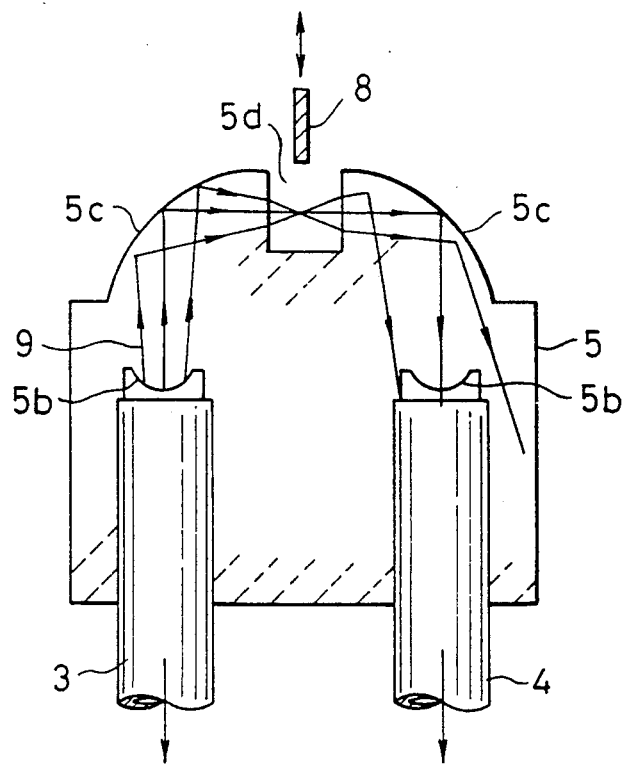
FIG. 34 is a cross-sectional view showing unimproved construction of the light-conducting prism of an embodiment corresponding to the improved prism of the embodiment shown in FIG. 13 and FIG. 15.
Figure 35:
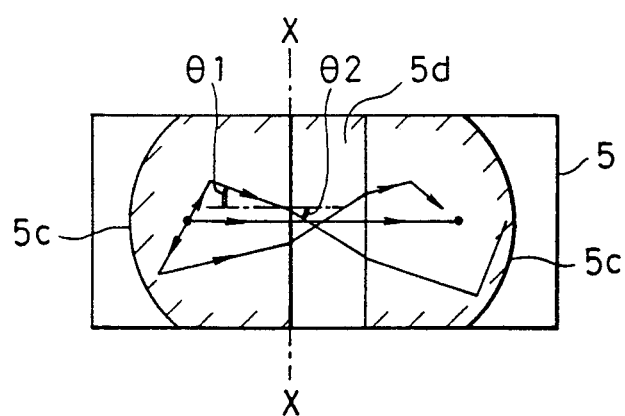
FIG. 35 is a plan view of the optical switch in FIG. 34.

Before describing the improved embodiment of FIGS. 13 to 16, the structure of an unimproved light-conducting prism according to an embodiment of the present invention will be described with reference to FIG. 34 and FIG. 35. In the unimproved light-conducting prism 5 in FIGS. 34 and 35, the inner surfaces of the light-conducting prism 5, which form boundaries separating the light-conducting prism 5 and air gap 5d in which the shutter 8 moves, are made planar. According to Snell's law, a light ray will be refracted when it passes through a boundary separating two different media. Consequently, the beam 9, emitted from the emitting optical fiber 3, transmitted through the focusing lens 5b, reflected at the corner-reflecting surface 5c, and sent into the air gap 5d to be focused, will be refracted at the boundary X—X between the light-conducting prism 5 and air gap 5d (see FIG. 35). Hence, as shown in FIG. 35, the angle of incidence $\theta 1$ and the angle of refraction $\theta 2$ are different when the beam 9 enters the air gap 5d at an oblique angle to the boundary X—X. A similar refraction will occur at the opposite boundary of the air gap 5d, and hence, the beam 9 will be inclined in various directions while it travels through the light-conducting prism 5.

This inclination of the beam 9 may cause a reduction of the transmission efficiency of the beam 9 because a part of the beam 9 emitted from the emitting optical fiber 3 is deflected from the correct transmission path and cannot reach the receiving optical fiber 4. In addition, the beam 9 is dispersed in the air gap 5d in which the shutter 8 moves, and so the beam will not be focused onto one point. As a result, a slight movement of the shutter 8 will not be sufficient to completely cut off the beam 9 traveling across the air gap 5d. This will adversely affect the stable switching of the beam 9.

In contrast, in the embodiment shown in FIGS. 13 and 14, the inner surfaces of the light-conducting prism 5 which form the boundaries separating the air gap 5d and light-conducting prism 5 have a spherical surface 5e whose center is located at the light-focusing point A at the center of the air gap 5d in which the shutter 8 passes.

In this arrangement, the beam 9 emitted from the emitting optical fiber 3 is transmitted through the focusing lens 5b, is reflected on the spherical corner-reflecting surface 5c, and is focused at the point A in the air gap 5d. In this process, the beam 9 passes the boundary of the spherical surface 5e in the direction normal to the boundary. Consequently, the beam 9 is not refracted at the boundary, advances straight ahead, and is focused at the point A in the air gap 5d. Likewise, while traveling the path between the air gap 5d and the receiving optical fiber 4, the beam 9 passes the other spherical surface 5e at the opposite side of the air gap 5d in the direction normal to the surface. After that, the beam 9 is reflected on the spherical corner-reflecting surface 5c, advances through the focusing lens 5b, and is focused onto the end face of the receiving optical fiber 4.

Thus, the inclination of the beam 9 from the correct path, which is caused by the refraction of the beam 9, can be eliminated. This greatly increases the transmission efficiency of the beam 9 between the emitting optical fiber 3 and the receiving optical fiber 4 via the light-conducting prism 5, in comparison with the unimproved structure of the embodiment shown in FIGS. 34 and 35. Furthermore, since almost all the beam 9 is focused at the point A in the air gap 5d in which the shutter 8 travels, the slightest movement of the shutter 8 is sufficient to switch the beam 9 from the cutoff state to transmitting state, or vice versa, thereby achieving a stable switching of the beam 9.

Figure 15:
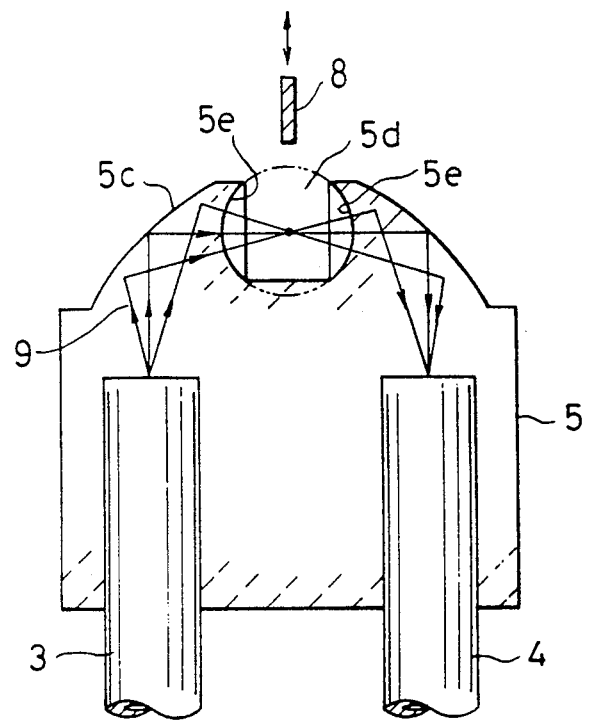
FIG. 15 is a cross-sectional view showing an improved light-conducting prism corresponding to the prism of the embodiment in FIG. 4.
Figure 16:
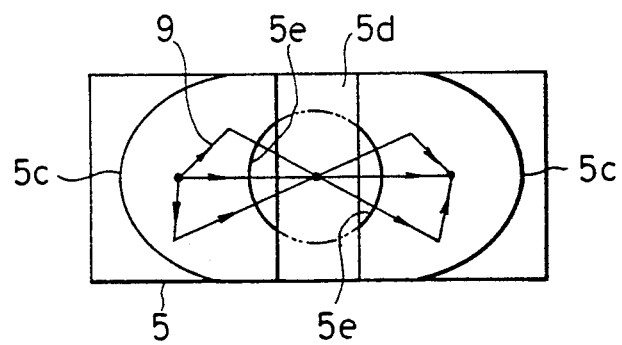
FIG. 16 is a plan view of the improved light-conducting prism in FIG. 15.

A similar effect can be accomplished in the embodiment shown in FIG. 15 and FIG. 16, which has elliptical corner-reflecting surfaces 5c of light-conducting prism 5 for focusing the beam 9 at one point in the air gap 5d. In this embodiment, the boundaries separating the air gap 5d and the surface areas of the light-conducting prism 5 are also formed spherically as are the surfaces 5e in the embodiment above.

Incidentally, the light-conducting prism 5 is made by molding a transparent resin. To form the air gap 5d during the molding process of the light-conducting prism 5, a cutting die is required. Hence, each boundary mentioned above cannot have a perfect spherical surface: a part of the boundary making contact with the removed section of the cutting die must have a cylindrical surface. It has, however, been confirmed that this does not adversely affect the function of the optical switch.

Figure 17:
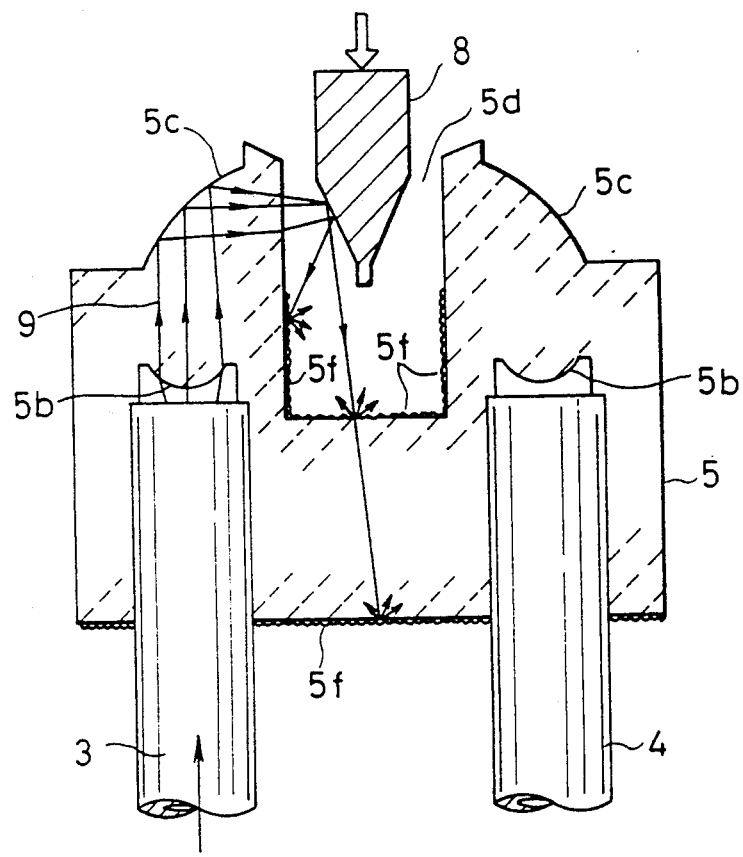
FIG. 17 is a cross-sectional view showing an improved light-conducting prism corresponding to the prism in FIG. 1.

FIG. 17 shows another improved embodiment of the light-conducting prism 5, and this will now be described.

Generally speaking, the greater the power ratio Pon/Poff is, the better the switching function will be (Pon is the power of the beam 9 transmitted from the emitting optical fiber 3 to the receiving optical fiber 4 when the optical switch is in the ON state; Poff is the power of the beam 9 transmitted from the emitting optical fiber 3 to the receiving optical fiber 4 when the optical switch is in the OFF state).

In the optical switch of FIG. 1, however, the ratio Pon/Poff may be decreased because of stray light produced by reflections of the beam 9 on the shutter 8 and the inner surfaces of the light-conducting prism 5: the beam 9, which is sent into the air gap 5d from the light-conducting prism 5, and is reflected repeatedly producing complicated multi-reflections on the surfaces of the shutter 8 and light-conducting prism 5, can reach the receiving optical fiber 4 passing under the tip of the shutter 8, even if the shutter 8 is plunged into the air gap 5d of the light-conducting prism 5, and hence, the optical switch is in the OFF state. When the stray light is transmitted to the receiving optical fiber 4 through the optical system in the optical switch, the ratio Pon/Poff is decreased, resulting in the degradation of the switching function, particularly the reduction of the dynamic range of the switching.

For this reason, in the embodiment shown in FIG. 17, the surface areas of the light-conducting prism 5, excluding the transmitting and reflecting surface areas along the correct path of the beam 9 between the emitting optical fiber 3 and receiving optical fiber 4, are formed as low-reflectance surfaces 5f. The low-reflectance surfaces 5f are formed by frosting the surfaces of the light-conducting prism 5 like the surface of a frosted glass, or by coating the surfaces with reflection-reducing film. In the light-conducting prism 5 shown in FIG. 17, the bottom surface of the light-conducting prism 5 and the bottom area of the air gap 5d are frosted to form the low-reflectance surfaces 5f.

Accordingly, when the shutter 8 is plunged into the air gap 5d of the light-conducting prism 5 as shown in FIG. 17 so as to cut the beam 9 off, the beam 9 reflected on the shutter 8 and deflected from the correct transmission path, will be attenuated by dispersion or absorption on the low-reflectance surfaces 5f before the beam reaches the receiving optical fiber 4.

As a result, the optical power received by the receiving optical fiber 4 is nearly zero when the switch is in the OFF state, and hence, the ratio Pon/Poff of the optical switch is greatly improved.

FIG. 18 to FIG. 32 show other embodiments of the optical switch having multiple functions: the optical switch described above is partially modified, and a secondary receiving optical fiber is added to the optical switch so that a switch-operation-indicating function or a transfer-switching function can be achieved.

Figure 18:
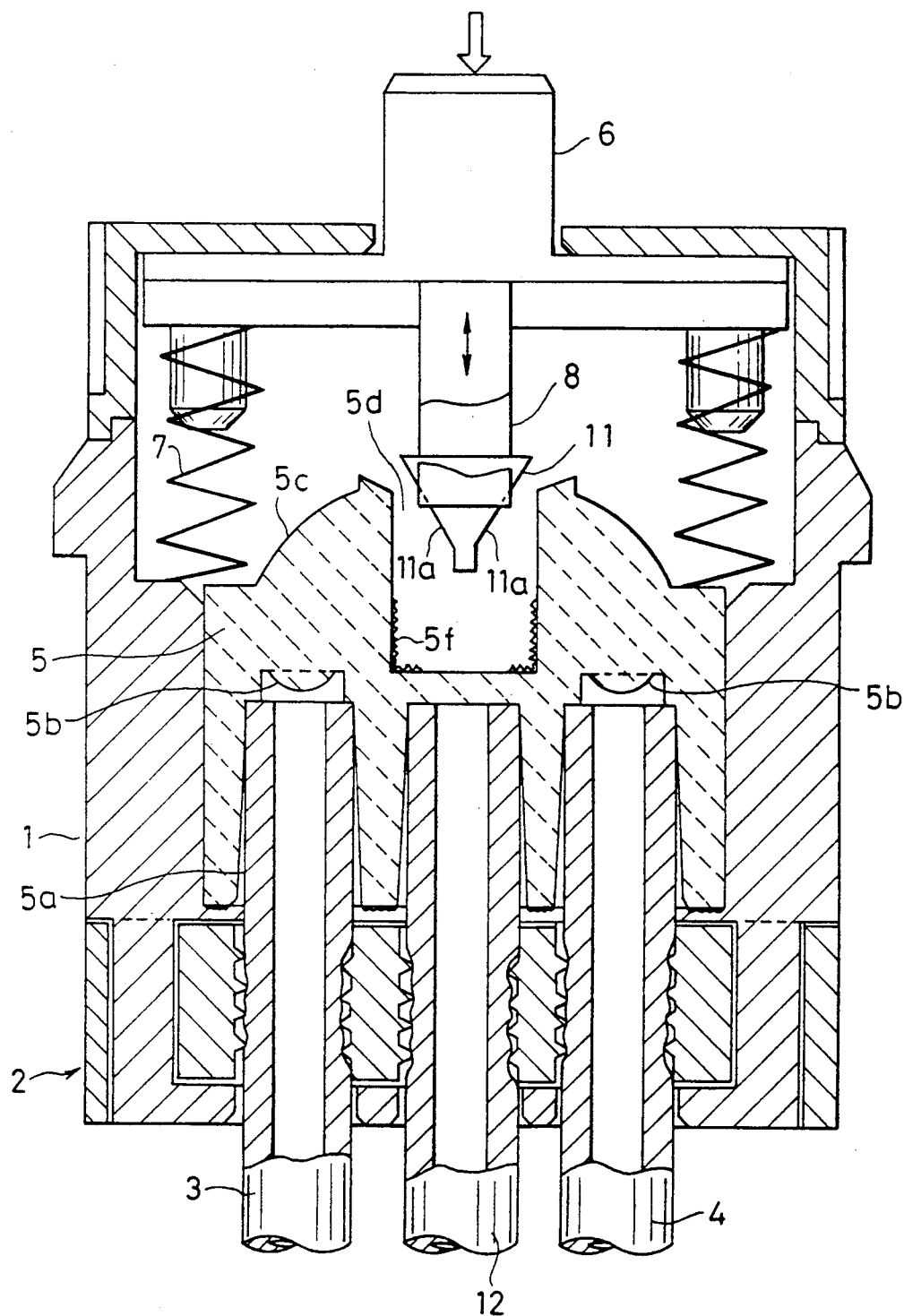
FIG. 18 is a cross-sectional view showing the inner structure of the optical switch of another embodiment of the present invention.

First, FIG. 18 shows a basic configuration of the optical switch according to an embodiment, and like numerals refer to like parts in FIG. 1.

The optical switch in FIG. 18 has a few components heretofore not described in addition to the optical switch shown in FIG. 1: a reflecting body 11 attached to the tip of the shutter 8; and a secondary receiving optical fiber 12 positioned under the reflecting body 11 in such a manner that they are facing each other.

The reflecting body 11 shown in FIG. 18 is a delta-shaped body which has two reflecting surfaces 11a formed symmetrically on either side thereof, and is attached to the actuator by way of the shutter 8: the reflecting surfaces 11a are inclined at 45 degrees to the horizontal. The reflecting body 11 is composed of a plastic material of a high reflectance, or the reflecting surfaces 11a are made mirror-like by plating with metal.

The secondary receiving optical fiber 12 is connected to the opposite side of the reflecting body 11 under the bottom surface of the air gap 5d in which the shutter 8 moves in such a manner that the secondary receiving optical fiber 12 is positioned between the emitting optical fiber 3 and the primary receiving optical fiber 4. Like the optical fibers 3 and 4, the secondary receiving optical fiber 12 is also inserted into the optical-fiber-insertion hole 5a which is tapered and has a polygon-shaped cross section as shown in FIG. 7 to FIG. 10. Thus, the secondary receiving optical fiber 12 is fastened to the terminal base 2 in the housing 1 by means of the holder 2b described in the embodiment shown in FIGS. 11 and 12. In addition, the low-reflectance surfaces 5f described in the embodiment of FIG. 17 are formed on surface areas of the light-conducting prism 5 where necessary.

The operating principle of the embodiment will be described with reference to FIG. 19 and FIG. 20. First, in the normal state, the actuator 6 is pushed up by means of the coil spring 7, and the reflecting body 11 attached to the shutter 8 is placed in the air gap 5d of the light-conducting prism 5 so as to block the optical path of the beam 9. Accordingly, the beam 9 entering the optical switch through the emitting optical fiber 3 is reflected on the reflecting surface 11a of the reflecting body 11 in the air gap 5d of the light-conducting prism 5, is directed downward and enters the secondary receiving optical fiber 12. Thus, in this state, the beam 9 is not transmitted to the primary receiving optical fiber 4, and hence, the circuit including the primary receiving optical fiber 4 is in the OFF state, whereas the circuit including the secondary receiving optical fiber 12 is in the ON state.

In contrast, when the actuator 6 is depressed as shown in FIG. 20, the beam 9 emitted from the emitting optical fiber 3 passes above the reflecting body 11 in the air gap 5d, travels straight ahead, is reflected on the corner-reflecting surface 5c on the opposite side, and is transmitted to the primary receiving optical fiber 4. Accordingly, in this state, the circuit including the primary receiving optical fiber 4 is in the ON state, whereas the circuit including the secondary receiving optical fiber 12 is in the OFF state.

Thus, an optical transfer switch similar to a contact-type microswitch (including a normally-on contact and a normally-off contact) can be obtained by detecting the output signals from the primary receiving optical fiber 4 and secondary receiving optical fiber 12 by using an external circuit. Furthermore, the operating state of the optical switch can be indicated by connecting the secondary receiving optical fiber 12 to a switch-operation indicator so as to display the ON/OFF state of the optical switch according to the output of the secondary receiving optical fiber 12.

Incidentally, two reflecting surfaces 11a of the reflecting body 11 are not necessary to achieve the function described above: one reflecting surface 11a facing the input side of the beam 9 can achieve the same function. However, two reflecting surfaces 11a formed symmetrically on either side of the bottom of reflecting body 11 make it possible for the optical switch to function as a bidirectional switch: the connection of the emitting optical fiber 3 and the primary receiving optical fiber 4 can be exchanged without changing the switching function of the optical switch.

FIG. 21 and FIG. 22 show an embodiment which functions in a manner opposite to the embodiment above: the circuit including the primary receiving optical fiber 4 is in the normal ON state, whereas the circuit including the secondary receiving optical fiber 12 is in the normal OFF state. In the normal state in FIG. 21, the reflecting body 11 of the shutter 8 is located at the top portion of the air gap 5d of the light-conducting prism 5 so that the beam 9 emitted from the emitting optical fiber 3 travels straight forward across the air gap 5d and is transmitted to the receiving optical fiber 4. Accordingly, the circuit including the primary receiving optical fiber 4 is in the ON state, whereas the circuit including the secondary receiving optical fiber 12 is in the OFF state. In contrast, when the actuator 6 is pushed down as shown in FIG. 22, the beam 9 is reflected on the reflecting surface 11a of the reflecting body 11, and is transmitted to the secondary receiving optical fiber 12. As a result, the circuit including the primary receiving optical fiber 4 changes to the OFF state, whereas the circuit including the secondary receiving optical fiber 12 changes to the ON state.

In FIG. 19 to FIG. 22, the corner-reflecting surfaces 5c of the light-conducting prism 5 are planar. However, to improve the switching characteristics such as transmission, cut off, and reflection of the beam 9 by focusing the dispersed beam 9 emitted from the emitting optical fiber 3 so as to facilitate the switching by the displacement of the shutter 8, the light-conducting members shown in FIG. 23 to FIG. 26 can be preferably used.

Figures 23, 24:
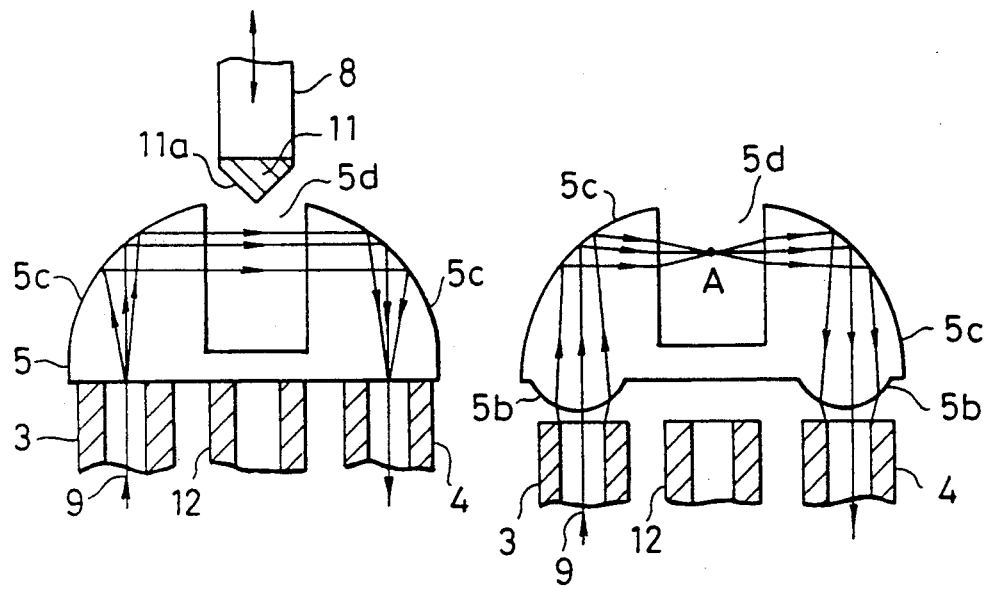
FIG. 23, FIG. 24, FIG. 25, FIG. 26, FIG. 27, and FIG. 28 are cross-sectional views, each of which shows a light-transmission path of a different embodiment corresponding to the optical switch shown in FIG. 18.
Figures 25, 26:
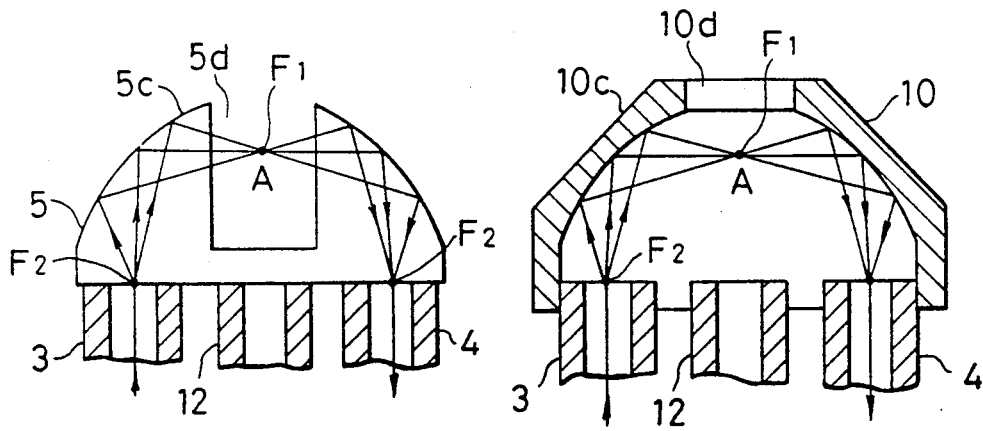

FIG. 23 shows the light-conducting prism 5 having spherical corner-reflecting surfaces 5c. The beam 9 emitted from the emitting optical fiber 3 with dispersion enters the light-conducting prism 5, is reflected on the corner-reflecting surface 5c, is collimated to a parallel beam, and is transmitted across the air gap 5d. FIG. 24 shows the light-conducting prism 5 having, in addition to the spherical corner-reflecting surfaces 5c, focusing lenses 5b formed on the incident and emitting areas of the beam 9, each of which faces the end faces of the optical fibers 3 and 4, respectively. These configurations can focus the beam 9 at the point A in the air gap 5d, as explained in the embodiment shown in FIG. 2 and FIG. 3. Furthermore, FIG. 25 shows a light-conducting member having a light-conducting prism 5 in which corner-reflecting surfaces 5c are formed in an elliptical surface, and FIG. 26 shows a light-conducting member of a concave reflector 10 as explained in the embodiments in FIG. 4 and FIG. 5. The focal points F1 of the elliptical corner-reflecting surfaces 5c and 10c are adjusted to the point A in the air gap 5d in which the reflecting body of shutter 8 (not shown) moves, and the focal points F2 thereof are adjusted to the end faces of the optical fibers 3 and 4. Thus, the beam 9 emitted from the emitting optical fiber 3 is reflected on the corner-reflecting surface 5c or 10c, and is focused at the point A in the air gap 5d, which corresponds to the focal point F1.

Next, configurations of reflecting surfaces 11a of the reflecting body 11, which appear to be appropriate to the various light-conducting members shown in FIG. 23 to FIG. 26, will be described.

First, in FIG. 23, the beam 9 is collimated by means of the spherical corner-reflecting surface 5c of the light-conducting prism 5, and is sent to the air gap 5d. In such a case, the reflecting surface 11a of the reflecting body 11, which reflects the beam 9 and inclines it towards the secondary receiving optical fiber 12, can be a planar surface.

Figure 27:
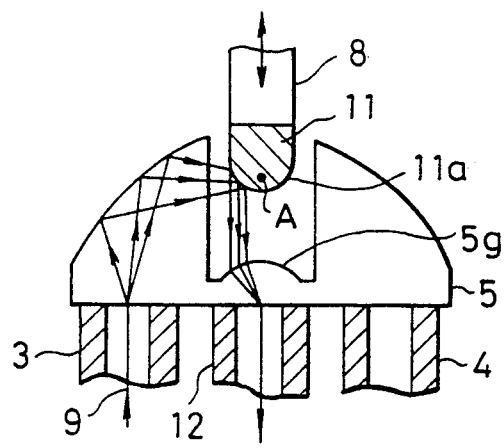

In contrast, in FIG. 24 to FIG. 26, the beam 9 is focused at the point A in the air gap 5d of the light-conducting member. In such a case, if a reflecting body 11 having a planar reflecting surface 11a is used, the beam 9 reflected on the reflecting surface 11a will not be collimated but will be dispersed. This will decrease the transmission efficiency of the beam 9 to the secondary receiving optical fiber 12. To overcome such an disadvantage, the reflecting surface 11a of the reflecting body 11 should be made parabolic as shown in FIG. 27 (the light-conducting prism 5 in FIG. 27 has elliptical corner-reflecting surfaces 5c) and in FIG. 28 (the concave reflector 10 in FIG. 28 has also elliptical corner-reflecting surfaces 10c). In these cases, the beam 9 reflected on the parabolic reflecting surface 11a is collimated, and is guided to the secondary receiving optical fiber 12, as long as the reflecting body 11 is positioned so that the focal point of the parabolic surface 11a agrees with the focusing point A of the beam 9 in the air gap 5d.

Figure 28:
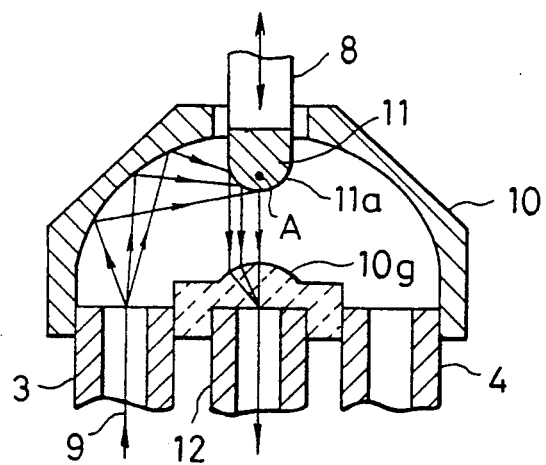

Furthermore, in FIG. 27 and FIG. 28, focusing lens 5g or 10g is provided at the incident area of the inclined beam 9 on the light-conducting member so as to face the end face of the secondary receiving optical fiber 12. As a result, the beam 9 reflected and inclined at the reflecting body 11 is focused onto the end face of the secondary receiving optical fiber 12 through the lens 5g or 10g.

When the light-conducting prism 5 shown in FIG. 23 is used, which collimates the beam 9 to be converged in the air gap 5d, and has a reflecting body 11 with planar reflecting surfaces 11a, the following problem is presented: the amount of the beam 9 incident to the secondary receiving optical fiber 12 will be greatly changed by the slightest displacement of the reflecting body 11. The reason for this will be described with reference to FIG. 36 to FIG. 38.

Figures 36, 37, 38:
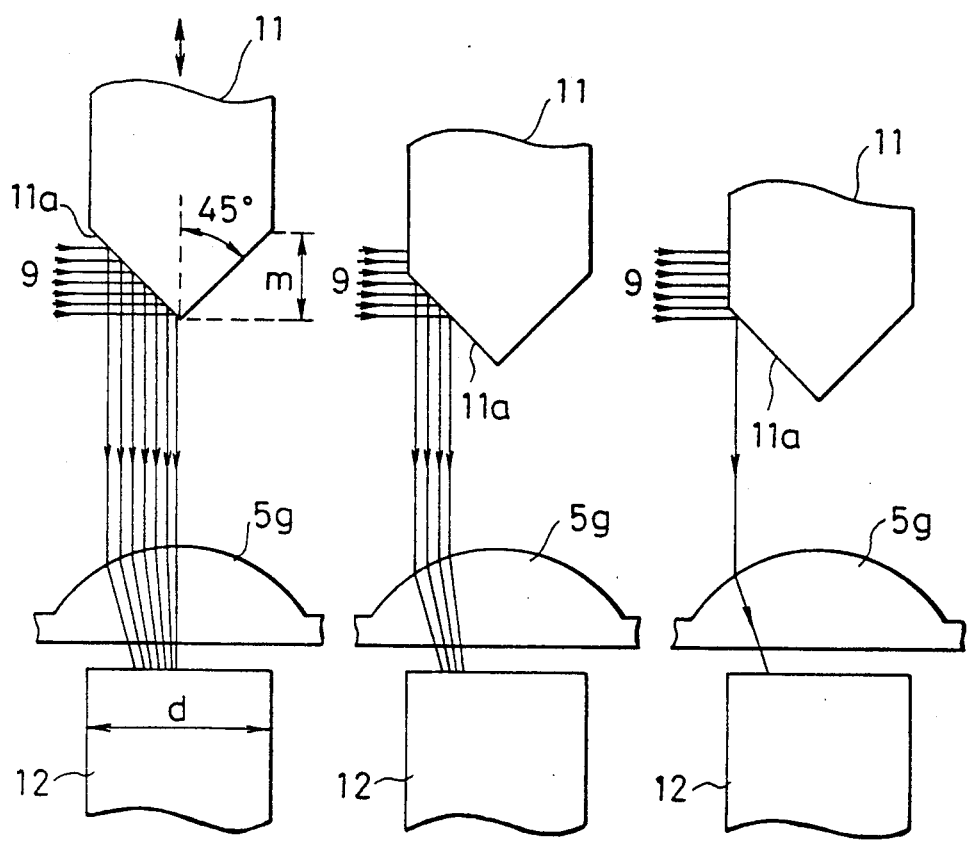
FIG. 36, FIG. 37, and FIG. 38 are cross-sectional views showing the relationship between the stroke position of the reflecting body and the amount of light entering into the secondary receiving optical fiber, each of which corresponds to FIG. 30, FIG. 31, and FIG. 32, respectively.

FIG. 36 to FIG. 38 show the relationships between the stroke positions of the reflecting body 11 and the amounts of the beam 9 transmitted to the optical fiber 12: the beam 9 is reflected and inclined at the planar reflecting surface 11a of the reflecting body 11, which is inclined at 45 degrees to the horizontal; and then, the inclined beam 9 is transmitted to the secondary receiving optical fiber 12. When the reflecting body 11 is placed at the correct position shown in FIG. 36, all of the beam 9 is reflected on the reflecting surface 11a (the projected area of the reflecting surface 11a is m in FIG. 36), and is transmitted to the secondary receiving optical fiber 12. In contrast, as shown in FIGS. 37 and 38, when the stroke position of the reflecting body 11 is located lower than that in FIG. 36, a part of or almost all the beam 9 is deflected from the reflecting surface 11a, and hence, the amount of the beam reaching the secondary receiving optical fiber 12 is considerably decreased, or greatly decreased to approximately zero. In other words, the slightest displacement of the stroke position caused by an assembling error or the like of the optical switch results in a great change of the amount of the incident beam on the secondary receiving optical fiber 12. FIGS. 37 and 38 show the stroke positions when the reflecting body 11 is positioned lower than the correct position in FIG. 36. In contrast, when the stroke position is located higher than the correct position, a part of the beam 9 passes under the tip of the reflecting body 11, and is transmitted to the primary receiving optical fiber 4, resulting in unstable switching.

Figure 29:
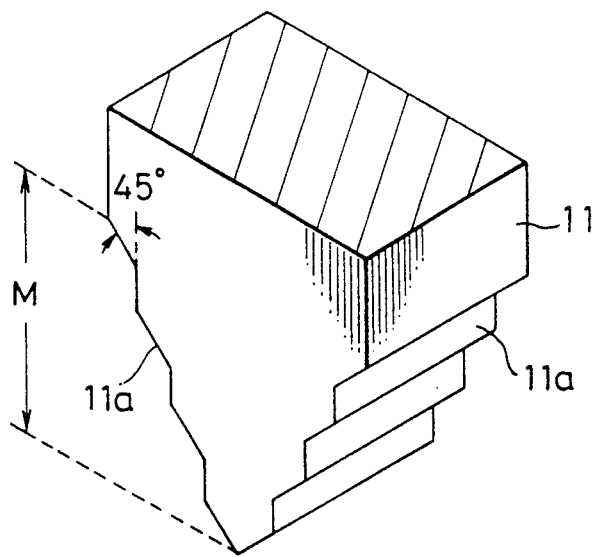
FIG. 29 is a perspective view showing an improved reflecting body of the shutter corresponding to the reflecting body in FIG. 18.
Figures 30, 31, 32:
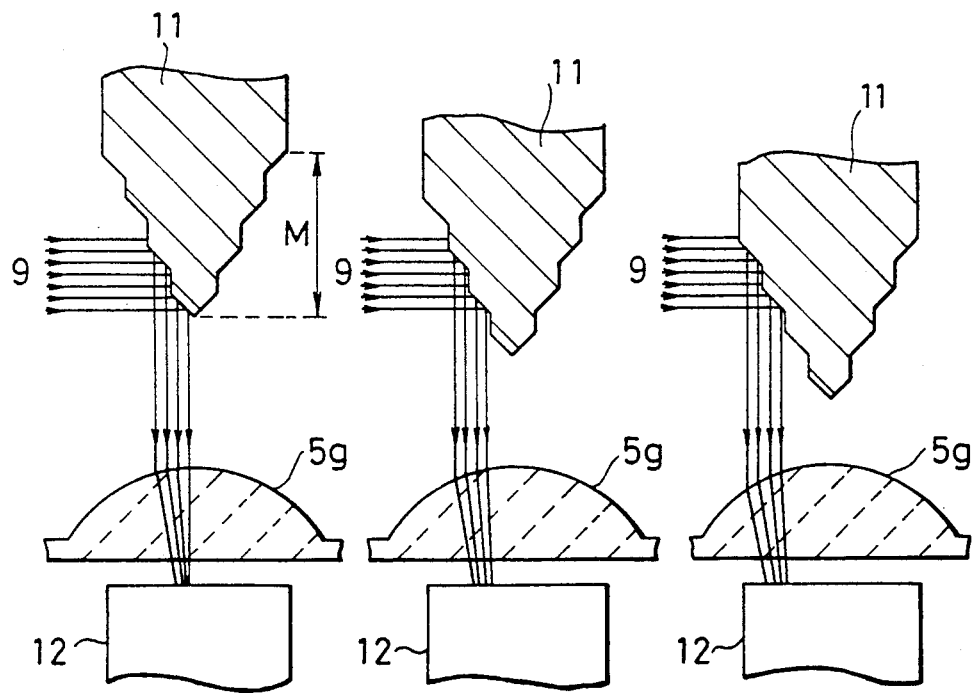
FIG. 30, FIG. 31 and FIG. 32 are cross-sectional views showing the relationship between the stroke position of the reflecting body and the amount of light entering into the secondary receiving optical fiber.

The problem described above can be solved by forming the reflecting surface 11a of the reflecting body 11 as shown in FIG. 29: the reflecting surface 11a is formed in a terraced configuration having steps each of which is composed of a vertical plane and an oblique plane meeting at 45 degrees with the vertical plane. Comparing the reflecting body 11 in FIG. 29 with that in FIG. 36, it is seen that the reflecting surface area M of the reflecting body 11 in FIG. 29 is greater than the reflecting surface area m in FIG. 36 (M>m) when the widths of the reflecting bodies 11 in FIGS. 29 and 36 are the same. Accordingly, a slight displacement of the stroke position of the reflecting body 11 as shown in FIG. 30 to FIG. 32 does not cause the problem described above: the beam 9 collimated to a parallel beam of a certain width is entirely contained in the reflecting surface area M, and hence, a constant amount of reflected light always enters the secondary receiving optical fiber 12. Thus, a slight displacement of the stroke position of the reflecting body 11 can be allowed, thereby increasing the tolerance of positioning of the reflecting body 11, as well as the tolerance of components of the optical switch.

Although specific embodiments of an optical switch constructed in accordance with the present invention have been disclosed, it is not intended that the invention be restricted to either the specific configurations or the uses disclosed herein. Modifications may be made in a manner obvious to those skilled in the art. Accordingly, it is intended that the invention be limited only by the scope of the appended claims.

What is claimed is:

1. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
   light-conducting means including said light-transmitting path which comprises two corner-reflecting surfaces and a first air gap located between said corner-reflecting surfaces;
   shutter means for turning on and off the light-transmission path by changing position in said first air gap, said shutter means being driven by said actuating means;
   housing means incorporating said light-conducting means and said shutter means; and
   focusing lensing means integrally provided on the entering area and the emitting area of said light-conducting means, said focusing lensing means comprising convex lenses facing, via narrow second air gaps, the end face of said emitting optical fiber and the end face of said receiving optical fiber, respectively.

2. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
   a light-conducting prism including said light-transmission path which comprises two corner-reflecting surfaces and an air gap located between said corner-reflecting surfaces, said corner-reflecting surfaces being spherical;
   shutter means for turning on and off the light-transmission path by changing position in said air gap, said shutter means being driven by said actuating means;
   housing means incorporating said light-conducting prism and said shutter means; and
   focusing lensing means provided on the entering area and the emitting area of said light-conducting prism, said focusing lensing means facing the end face of said emitting optical fiber and the end face of said receiving optical fiber, respectively.

3. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
   light-conducting means including said light-transmitting path which comprises two corner-reflecting surfaces and an air gap located between said corner-reflecting surfaces;
   shutter means for turning on and off the light-transmission path by changing position in said air gap, said shutter means being driven by said actuating means; and
   housing means incorporating said light-conducting means and said shutter means,
   wherein said light-conducting means comprises a prism or a concave reflector, said corner-reflecting surfaces of said prism and concave reflector having first and second spaced elliptical surfaces with first and second focal points, the first focal points of said first and second elliptical surfaces being adjusted to a focusing point located on the middle line of said air gap, and the second focal points of said first and second elliptical surfaces being adjusted to the end faces of said emitting optical fiber and said receiving optical fiber, respectively.

4. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
   a light-conducting prism including said light-transmission path which comprises two corner-reflecting surfaces and an air gap located between said corner-reflecting surfaces;

shutter means for turning on and off the light-transmission path by changing position in said air gap, said shutter means being driven by said actuating means;

housing means incorporating said light-conducting prism and said shutter means; and focusing lensing means provided on the entering area and the emitting area of said light-conducting prism, said focusing lensing means facing the end face of said emitting optical fiber and the end face of said receiving optical fiber, respectively;

wherein said corner-reflecting surfaces of said light-conducting prism have eliptical surfaces whose first focal points are adjusted to a focusing point located on the middle line of said air gap in which said shutter means moves and wherein focal points of said focusing lensing means are adjusted to second focal points of said elliptical surfaces of the corner-reflecting surfaces of said light-conducting prism.

5. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:

a light-conducting prism including said light-transmission path which comprises two corner-reflecting surfaces and an air gap located between said corner-reflecting surfaces;

shutter means for turning on and off the light-transmission path by changing position in said air gap, said shutter means being driven by said actuating means;

housing means incorporating said light-conducting prism and said shutter means; and insertion holes provided in said light-conducting prism for inserting said emitting optical fiber and said receiving optical fiber, each of said insertion holes being tapered, having a circular cross section at the entrance thereof, and having a polygonal cross section at the innermost end thereof, the diameter of said entrance being slightly greater than the maximum diameter allowed by the tolerance of said optical fibers, and the diameter of the inscribed circle in said innermost end being slightly smaller than the minimum diameter allowed by the tolerance of said optical fibers.

6. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:

light-conducting means including said light-transmitting path which comprises two corner-reflecting surfaces and a first air gap located between said corner-reflecting surfaces;

shutter means for turning on and off the light-transmission path by changing position in said first air gap between first and second positions, said shutter means being driven by said actuating means;

housing means incorporating said light-conducting means and said shutter means;

focusing lensing means integrally provided between the emitting and receiving fibers in narrow second air gaps, said focusing lensing means comprising convex lenses; and a coil spring for returning said actuating means to said first position, wherein said actuating means is a push-button connected directly to said shutter means, said push button being incorporated in said housing means and operating in conjunction with said coil spring.

7. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:

light-conducting means including said light-transmitting path which comprises two corner-reflecting surfaces and an air gap located between said corner-reflecting surfaces;

shutter means for turning on and off the light-transmission path by changing position in said air gap, said shutter means being driven by said actuating means;

housing means incorporating said light-conducting means and said shutter means; and connecting terminal means provided in said housing means for fastening said emitting and receiving optical fibers in position, said connecting terminal means comprising a base combined with a holder to provide a quick-connect device.

8. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:

a light-conducting prism including said light-transmission path which comprises two corner-reflecting surfaces, an air gap located between said corner-reflecting surfaces, and focusing lensing means facing the end faces of said emitting and receiving optical fibers;

shutter means for turning on and off the light-transmission path by changing position in said air gap, said shutter means being driven by said actuating means; and housing means incorporating said light-conducting prism and said shutter means, wherein said light-conducting prism is provided with spherical surfaces separating said light-conducting prism and said air gap in which said shutter moves, the center of said spherical surface being positioned at the light-focusing point in said air gap.

9. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:

a light-conducting prism including said light-transmission path which comprises two spherical corner-reflecting surfaces and an air gap located between said corner-reflecting surfaces;

shutter means for turning on and off the light-transmission path by changing position in said air gap, said shutter means and being driven by said actuating means;

housing means incorporating said light-conducting prism and said shutter means, wherein said light-conducting prism is provided with spherical surfaces separating said light-conducting prism and said air gap in which said shutter moves, the center of said spherical surface being positioned at the light-focusing point in said air gap.

10. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:

a light-conducting prism including said light-transmission path which comprises two elliptical corner-reflecting surfaces and an air gap located between said corner-reflecting surfaces;

shutter means for turning on and off the light-transmission path by changing position in said air gap, said shutter means being driven by said actuating means; and housing means incorporating said light-conducting prism and said shutter means, wherein said light-conducting prism is further provided with spherical surfaces separating said light-conducting prism and said air gap in which said shutter moves, the center of said spherical surface being positioned at the light-focusing point in said air gap.

11. An optical switch connected to an emitting optical fiber and a receiving optical fiber, said optical switch having a light-transmission path between the emitting optical fiber and receiving optical fiber, said light-transmission path being mechanically opened and closed by an actuating means, thereby turning on and off a light signal transmitted through the light-transmission path, said optical switch comprising:

a light-conducting prism including said light-transmission path which comprises two corner-reflecting surfaces and an air gap located between said corner-reflecting surfaces;

shutter means for turning on and off the light-transmission path by changing position in said air gap, said shutter means being driven by said actuating means; and housing means incorporating said light-conducting prism and said shutter means, wherein surface areas of said light-conducting prism excluding light-transmitting surface areas and light-reflecting surface areas along said light-transmission path between said emitting optical fiber and said receiving optical fiber are made low-reflectance surfaces.

12. An optical switch connected to an emitting optical fiber and a receiving optical fiber, said optical switch having a light-transmission path between the emitting optical fiber and the receiving optical fiber, said light-transmitting path being mechanically opened and closed by an actuating means, thereby turning on and off a light signal transmitted through the light-transmission path, said optical switch comprising:

light-conducting means including said light-transmitting path which comprises two corner-reflecting surfaces and an air gap located between said corner-reflecting surfaces;

shutter means for turning on and off the light-transmission path by changing position in said air gap between first and second positions, said shutter means being driven by said actuating means;

housing means incorporating said light-conducting means and said shutter means;

reflecting means provided at the tip of said shutter means for reflecting a beam emitted from said emitting optical fiber so as to incline the beam by approximately 90 degrees in said air gap of said light-conducting means; and a secondary receiving optical fiber provided in addition to said receiving optical fiber, said secondary receiving optical fiber being positioned in alignment with the traveling path of the beam inclined by said reflecting means.

13. An optical switch according to claim 12, wherein said reflecting means provided at the tip of said shutter means comprises two reflecting surfaces symmetrically formed on either side of said tip of the shutter means.

14. An optical switch according to claim 12 further comprising focusing lensing means provided on said light-conducting means facing an end face of said secondary receiving optical fiber, the beam inclined by said reflecting means of said shutter means being focused onto the end face of said secondary receiving optical fiber.

15. An optical switch according to claim 12, wherein said corner-reflecting surfaces of said light-conducting means are spherical, and said reflecting means provided at the tip of said shutter means is a planar reflecting surface.

16. An optical switch according to claim 12, wherein said corner-reflecting surfaces of said light-conducting means are elliptical, and said reflecting means provided at the tip of said shutter means is a parabolic reflecting surface.

17. An optical switch according to claim 12, wherein said reflecting surfaces provided at the tip of said shutter means has a terraced reflecting surface, each step of said terraced reflecting surface being composed of a vertical plane and an inclined plane.

18. An optical switch according to claim 12, wherein said light-conducting means is a light-conducting prism, said light-conducting prism further comprising focusing lensing means provided on the entering area and the emitting area of said light-conducting prism, said focusing lensing means facing the end face of said emitting optical fiber and the end face of said receiving optical fiber, respectively.

19. An optical switch according to claim 12, wherein said light-conducting means is a light-conducting prism, said light-conducting prism further comprising insertion holes for inserting said emitting optical fiber and said receiving optical fiber, each of said insertion holes being tapered, having a circular cross section at the entrance thereof, and having a polygonal cross section at the innermost end thereof, the diameter of said entrance being slightly greater than the maximum diameter allowed by the tolerance of said optical fibers, and the diameter of the inscribed circle in said innermost end being slightly smaller than the minimum diameter allowed by the tolerance of said optical fibers.

20. An optical switch according to claim 12 further comprising a coil spring for returning said actuating means to said first position, wherein said actuating means is a push-button directly connected to said shutter means, said push-button being incorporated in said housing means and operating in conjunction with said coil spring.

21. An optical switch according to claim 12 further comprising a connecting terminal means provided in said housing means for fastening said emitting and receiving optical fibers in position, said connecting terminal means comprising a base combined with a holder for fastening said optical fibers.

22. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
- a light-conducting prism including said light-transmission path which comprises two corner-reflecting surfaces, and an air gap located between said corner-reflecting surfaces;
- focusing lensing means provided on said light-conducting prism and facing the end faces of said emitting and receiving optical fibers;
- shutter means for turning on and off the light-transmission path by changing position in said air gap, said shutter means being driven by said actuating means;
- reflecting means provided at the tip of said shutter means for reflecting a beam emitted from said emitting optical fiber so as to incline the beam by approximately 90 degrees in said air gap of said light-conducting means; and
- a secondary receiving optical fiber provided in addition to said receiving optical fiber, said secondary receiving optical fiber being positioned in alignment with the traveling path of the beam inclined by said reflecting means,
- wherein said light-conducting prism is provided with spherical surfaces separating said light-conducting prism and said air gap in which said shutter moves, the center of said spherical surface being positioned at a light-focusing point in said air gap.

23. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
- a light-conducting prism including said light-transmission path which comprises two spherical corner-reflecting surfaces, and an air gap located between said corner-reflecting surfaces;
- shutter means for turning on and off the light-transmission path by changing position in said air gap, said shutter means being driven by said actuating means;
- reflecting means provided at the tip of said shutter means for reflecting a beam emitted from said emitting optical fiber so as to incline the beam by approximately 90 degrees in said air gap of said light-conducting means; and
- a secondary receiving optical fiber provided in addition to said receiving optical fiber, said secondary receiving optical fiber being positioned so as in alignment with the traveling path of the beam inclined by said reflecting means,
- wherein said light-conducting prism is provided with spherical surfaces separating said light-conducting prism and said air gap in which said shutter moves, the center of said spherical surface being positioned at a light-focusing point in said air gap.

24. An optical switch connected to an emitting optical fiber and a receiving optical fiber, said optical switch having a light-transmission path between the emitting optical fiber and the receiving optical fiber, said light-transmission path being mechanically opened and closed by an actuating means thereby turning on and off a light signal transmitted through the light-transmission path, said optical switch comprising:
- a light-conducting prism including said light-transmission path which comprises two elliptical corner-reflecting surfaces, and an air gap located between said corner-reflecting surfaces;
- shutter means for turning on and off the light-transmission path by changing position in said air gap, said shutter means being driven by said actuating means;
- reflecting means provided at the tip of said shutter means for reflecting a beam emitted from said emitting optical fiber so as to incline the beam by approximately 90 degrees in said air gap of said light-conducting means; and
- a secondary receiving optical fiber provided in addition to said receiving optical fiber, said secondary receiving optical fiber being positioned in alignment with the traveling path of the inclined beam by said reflecting means,
- wherein said light-conducting prism is provided with spherical surfaces separating said light-conducting prism and said air gap in which said shutter moves, the center of said spherical surface being positioned at a light-focusing point in said air gap.

25. An optical switch connected to an emitting optical fiber and a receiving optical fiber, said optical switch having a light-transmission path between the emitting optical fiber and the receiving optical fiber, said light-transmission path being mechanically opened and closed by an actuating means, thereby turning on and off a light signal transmitted through the light-transmission path, said optical switch comprising:
- a light-conducting prism including said light-transmission path which comprises two corner-reflecting surfaces, and an air gap located between said corner-reflecting surfaces;
- shutter means for turning on and off the light-transmission path by changing position in said air gap, said shutter means being driven by said actuating means;
- reflecting means provided at the tip of said shutter means for reflecting a beam emitted from said emitting optical fiber so as to incline the beam by approximately 90 degrees in said air gap of said light-conducting means; and
- a secondary receiving optical fiber provided in addition to said receiving optical fiber, said secondary receiving optical fiber being positioned in alignment with the traveling path of the inclined beam by said reflecting means,
- wherein surface areas of said light-conducting prism excluding light-transmitting surface areas and light-reflecting surface areas along said light-transmission path between said emitting optical fiber and said receiving optical fiber are made low-reflectance surfaces.

* * * * *